United States Patent
Kurtz et al.

(10) Patent No.: US 6,947,459 B2
(45) Date of Patent: Sep. 20, 2005

(54) ORGANIC VERTICAL CAVITY LASER AND IMAGING SYSTEM

(75) Inventors: Andrew F. Kurtz, Rochester, NY (US); Marek W. Kowarz, Henrietta, NY (US); Brian E. Kruschwitz, Rochester, NY (US); Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 400 days.

(21) Appl. No.: 10/304,078

(22) Filed: Nov. 25, 2002

(65) Prior Publication Data

US 2004/0101008 A1 May 27, 2004

(51) Int. Cl.[7] .................................................. H01S 5/00
(52) U.S. Cl. ............................ 372/43; 372/39; 372/45; 372/96; 372/75
(58) Field of Search ............................. 372/43, 45, 39, 372/96

(56) References Cited

U.S. PATENT DOCUMENTS

| | | |
|---|---|---|
| 3,202,039 A | 8/1965 | DeLang et al. |
| 4,281,904 A | 8/1981 | Sprague et al. ............ 350/356 |
| 4,345,258 A | 8/1982 | Tsai et al. |
| 4,376,568 A | 3/1983 | Sprague |
| 4,389,659 A | 6/1983 | Sprague ................... 346/151.1 |
| 4,560,994 A | 12/1985 | Sprague |
| 4,591,260 A | 5/1986 | Yip ............................ 355/3 R |
| 4,718,069 A | 1/1988 | Streifer et al. |
| 4,728,965 A | 3/1988 | Kessler et al. |
| 4,786,918 A | 11/1988 | Thornton et al. ........... 346/108 |
| 4,803,691 A | 2/1989 | Scifres et al. |
| 4,804,975 A | 2/1989 | Yip ............................. 346/762 |
| 4,960,320 A | 10/1990 | Taniura ....................... 350/171 |

(Continued)

FOREIGN PATENT DOCUMENTS

| | | |
|---|---|---|
| EP | 1 257 027 A1 | 11/2002 |
| EP | 1 333 550 A2 | 8/2003 |
| EP | 1 359 752 A2 | 11/2003 |
| EP | 1 365 490 A2 | 11/2003 |

OTHER PUBLICATIONS

S. Kinoshita and K. Iga; Circular Buried Heterostructure (CBH) GaAlAs/GaAs Surface Emitting Lasers; IEEE Journal of Quantum Electronics, vol. QE–23, No. 6, Jun. 1987, pp. 882–888.

V.G. Kozlov et al.; Study of Lasing Action Based on Forster Energy Transfer in Optically Pumped Organic Semiconductor Thin Films; Journal of Applied Physics, vol. 84, No. 8, Oct. 1998, pp. 4096–4106.

N. Tessler et al.; High Peak Brightness Polymer Light–Emitting Diodes; Advanced Materials, 1998, pp. 64–68.

(Continued)

*Primary Examiner*—Minsun Oh Harvey
*Assistant Examiner*—Dung (Michael) T Nguyen
(74) *Attorney, Agent, or Firm*—Nelson Adrian Blish

(57) ABSTRACT

An organic vertical cavity laser light producing device (10) comprises a substrate (20). A plurality of laser emitters (200) emits laser light in a direction orthogonal to the substrate. Each laser emitter within the plurality of laser emitters has a first lateral mode structure in a first axis orthogonal to the laser light direction and has a second lateral mode structure in a second axis orthogonal to both the laser light direction and the first axis. Each laser emitter comprises a first mirror provided on a top surface of the substrate (20) and is reflective to light over a predetermined range of wavelengths. An organic active region (40) produces laser light (350). A second mirror is provided above the organic active region and is reflective to light over a predetermined range of wavelengths. A pumping means excites the plurality of laser emitters.

127 Claims, 16 Drawing Sheets

U.S. PATENT DOCUMENTS

| | | | |
|---|---|---|---|
| 4,982,206 A | 1/1991 | Kessler et al. | |
| 5,098,183 A | 3/1992 | Sonehara | |
| 5,233,459 A | 8/1993 | Bozler et al. | |
| 5,311,360 A | 5/1994 | Bloom et al. | |
| 5,384,797 A | 1/1995 | Welch et al. | |
| 5,410,370 A | 4/1995 | Janssen | |
| 5,469,610 A | 11/1995 | Courian et al. | |
| 5,488,504 A | 1/1996 | Worchesky et al. | |
| 5,521,748 A | 5/1996 | Sarraf | 359/321 |
| 5,535,047 A | 7/1996 | Hornbeck | |
| 5,614,961 A | 3/1997 | Gibeau et al. | |
| 5,745,153 A | 4/1998 | Kessler et al. | |
| 5,841,579 A | 11/1998 | Bloom et al. | |
| 5,854,651 A | 12/1998 | Kessler et al. | |
| 5,861,992 A | 1/1999 | Gelbart | |
| 5,881,083 A | 3/1999 | Diaz-Garcia et al. | |
| 5,881,089 A | 3/1999 | Berggren et al. | |
| 5,900,981 A | 5/1999 | Oren et al. | |
| 5,923,475 A * | 7/1999 | Kurtz et al. | 359/619 |
| 5,954,424 A | 9/1999 | Anderson et al. | |
| 5,982,553 A | 11/1999 | Bloom et al. | |
| 5,990,983 A | 11/1999 | Hargis et al. | |
| 5,991,065 A | 11/1999 | Nutt et al. | |
| 5,995,475 A | 11/1999 | Gelbart | |
| 5,997,150 A | 12/1999 | Anderson | |
| 6,025,859 A | 2/2000 | Ide et al. | |
| 6,079,833 A | 6/2000 | Kaelin et al. | |
| 6,084,626 A | 7/2000 | Ramanujan et al. | |
| 6,088,102 A | 7/2000 | Manhart | |
| 6,137,631 A | 10/2000 | Moulin | |
| 6,160,828 A * | 12/2000 | Kozlov et al. | 372/39 |
| 6,166,759 A | 12/2000 | Blanding | |
| 6,169,565 B1 | 1/2001 | Ramanujan et al. | |
| 6,194,119 B1 | 2/2001 | Wolk et al. | |
| 6,215,547 B1 | 4/2001 | Ramanujan et al. | |
| 6,215,579 B1 | 4/2001 | Bloom et al. | |
| 6,215,598 B1 | 4/2001 | Hwu | |
| 6,229,650 B1 | 5/2001 | Reznichenko et al. | |
| 6,240,116 B1 | 5/2001 | Lang et al. | |
| 6,243,194 B1 | 6/2001 | Brazas, Jr. et al. | |
| 6,252,621 B1 | 6/2001 | Kessler et al. | |
| 6,307,663 B1 | 10/2001 | Kowarz | |
| 6,330,018 B1 | 12/2001 | Ramanujan et al. | |
| 6,335,831 B2 | 1/2002 | Kowarz et al. | |
| 6,411,425 B1 | 6/2002 | Kowarz et al. | |
| 6,429,461 B1 | 8/2002 | Tanaka et al. | |
| 2004/0004988 A1 | 1/2004 | Cok et al. | |

OTHER PUBLICATIONS

M.D. McGehee; Semiconducting Polymer Distributed Feedback Lasers; Applied Physics Letters, vol. 72, No. 13, Mar. 1998, pp. 1536–1538.

M. Berggren et al.; Light Amplification in Organic Thin Films Using Cascade Energy Transfer; Letters to Nature, pp. 466–469.

S. Corzine et al.; Design of Fabry–Perot Surface–Emitting Lasers with a Periodic Gain Structure; IEEE Journal of Quantum Electronics, vol. 25, No. 6, Jun. 1989, pp. 1513–1524.

A.G. Fox and T. Li; Resonant Modes in a Master Interferometer; The Bell System Technical Journal, Mar. 1961, pp. 453–480.

H. Kogelnik; Theory of Dielectric Waveguides; Integrated Optics, 1979, pp. 13–81.

S. Riechel et al.; Very Compact Tunable Solid–State Laser Utilizing a Thin–Film Organic Semiconductor; Optics Letter, vol. 26, No. 9, May 2001, pp. 593–595.

* cited by examiner

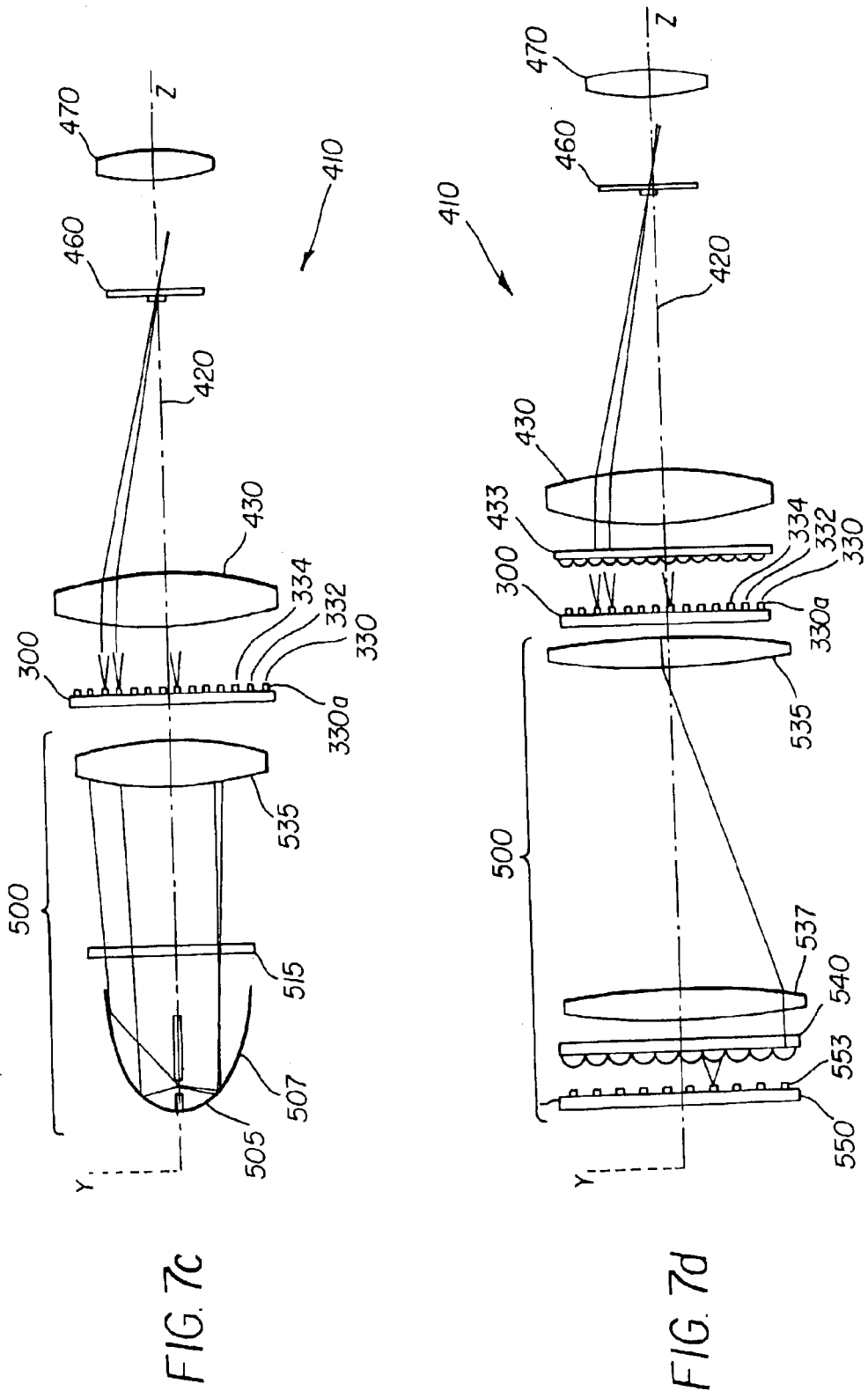

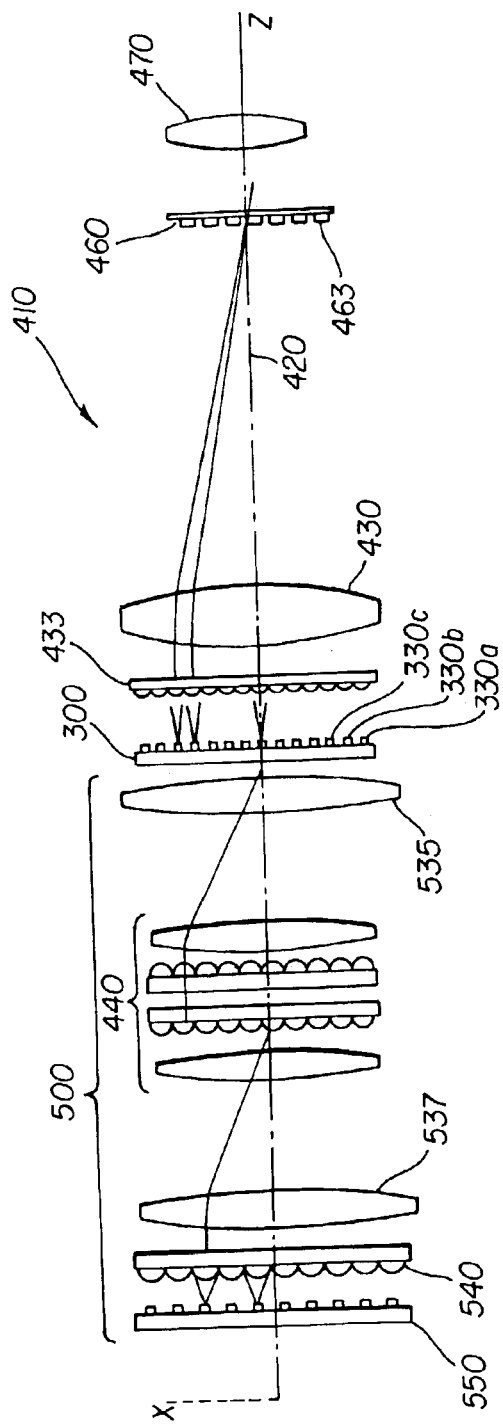
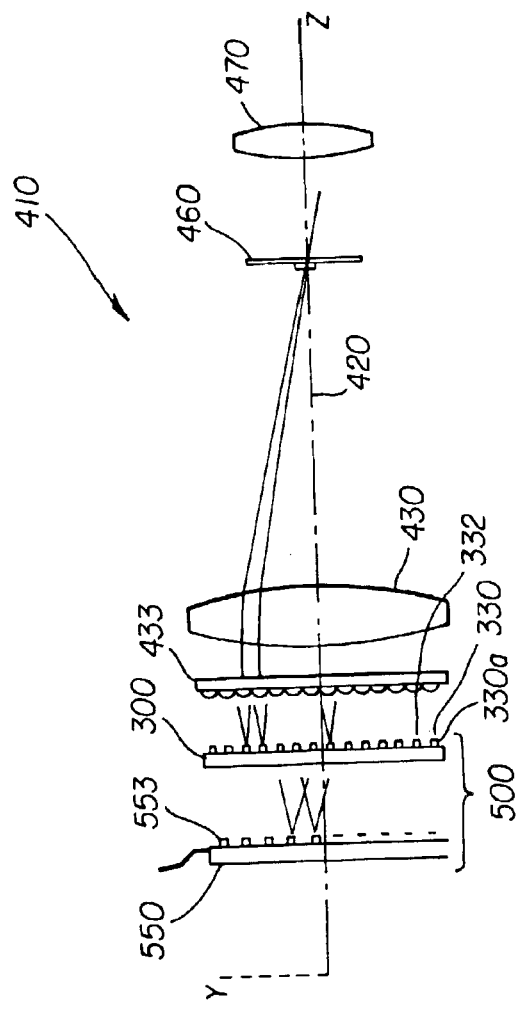
FIG. 7e
FIG. 7f

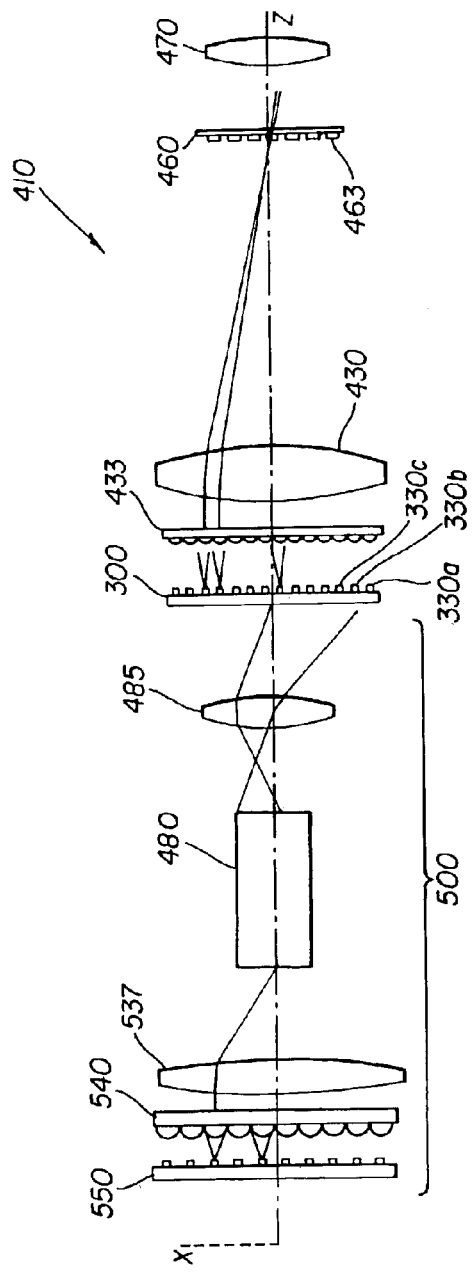
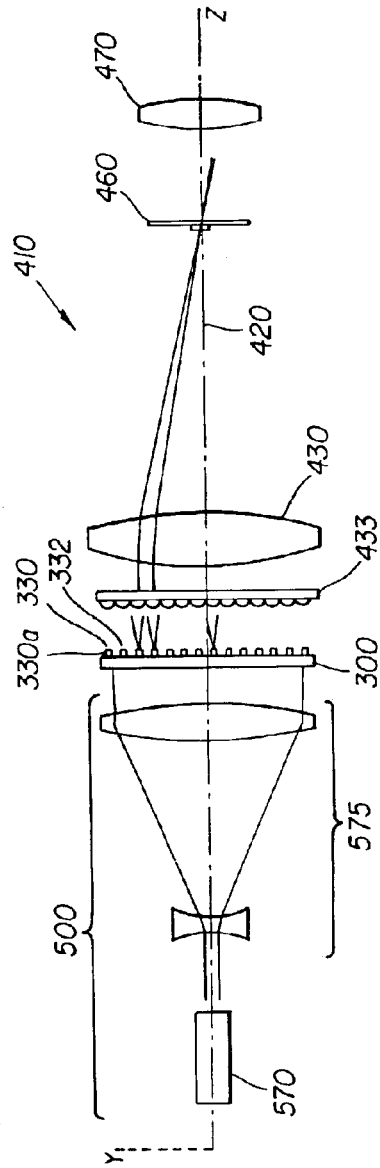
FIG. 7g
FIG. 7h

ORGANIC VERTICAL CAVITY LASER AND IMAGING SYSTEM

CROSS REFERENCE TO RELATED APPLICATIONS

Reference is made to commonly assigned U.S. patent application Ser. No. 09/832,759 filed Apr. 11, 2001 entitled INCOHERENT LIGHT-EMITTING DEVICE APPARATUS FOR DRIVING VERTICAL LASER CAVITY, by Kahen et al.; U.S. patent application Ser. No. 10/066,829 filed Feb. 4, 2002 entitled ORGANIC VERTICAL CAVITY PHASE-LOCKED LASER ARRAY DEVICE, by Keith B. Kahen; and U.S. patent application Ser. No. 10/137,761 filed May 2, 2002, entitled SCANNED DISPLAY SYSTEMS USING COLOR LASER LIGHT SOURCES, by Spoonhower et al.; and U.S. patent application Ser. No. 10/066,936, filed Feb. 4, 2002, entitled ORGANIC VERTICAL CAVITY LASING DEVICES CONTAINING PERIODIC GAIN REGIONS, by Kahen et al., the disclosures of which are incorporated herein.

FIELD OF THE INVENTION

The present invention relates to electronic display and printing systems generally, and more particularly to electronic display and printing systems that employ organic laser light sources.

BACKGROUND OF THE INVENTION

Laser based electronic imaging systems have been developed for use both in projection display, and even more extensively, for printing applications. In particular, laser projection display systems have been developed with several basic architectures, which include vector scanning, raster scanning, one-dimensional (1-D) scanning, and two-dimensional (2-D) area imaging systems. The development of laser projection systems, which are typically intended to be multi-color, have been generally limited by the minimal availability of useful visible wavelength lasers. On the other hand, laser based printing systems have been extensively developed using all of these same architectures, with the possible exception of vector scanning. As a result, many of the laser beam shaping and laser beam modulation techniques applicable to laser projection have been previously developed in great detail and variation by the efforts directed to laser printing. Notably, however, most of the laser printing systems described in the prior art are monochrome, and utilize infrared lasers, rather than the multiple visible spectrum lasers desired for laser projection.

In a typical laser printer, radiation from a laser is shaped, and imaged onto a film plane to produce the desired spot size. The spot, called a pixel, forms the smallest image element of the image. The laser radiation is modulated to create the correct density of each spot, pixel by pixel. The laser spot is scanned in the line direction, and the media is moved in the page scan direction to create a two-dimensional image. In a printer system with a continuous wave (CW) gas or solid state laser, an external modulator, such as an acousto-optical device, is often used to input the image data into the optical beam. Whereas, in systems with semi-conductor diode lasers, the laser radiation is typically modulated directly by varying the current input to the laser. For printers using high sensitivity media such as a silver halide film, high printing throughput is obtained by scanning the laser beam in the line direction with a polygonal mirror or a galvanometer. These printers are called "flying spot" printers.

By comparison, when the print media has a low optical sensitivity (such as most thermal media), the typical laser printer employs high power laser sources and slow line and page scan speeds to meet the high exposure requirements. One way to achieve this type of scan is to configure the printer like a "lathe," where the page scan is obtained by rotating a drum which holds the film, and line scan, by translating the laser in a direction parallel to the axis of rotation of the drum. To achieve this high optical power throughput, in a small package, with a relatively low cost, the technology has adapted to provide multiple writing spots directed to the target plane.

Multi-spot printers have been configured in systems using a single laser as the light source, where the light illuminates a linear spatial light modulator array, which is in turn imaged to the target plane. Exemplary systems are described in several prior art patents, including U.S. Pat. Nos. 4,389,659 by Sprague, 4,591,260 by Yip, and 4,960,320 by Tanuira. However, the high power single beam lasers are typically too large and expensive to use in many printing applications. Moreover, such systems are sensitive to the potential failure of the laser source.

In another approach, a monolithic array of laser sources is imaged directly onto a light sensitive media to produce multiple spots. The power to each element of the laser array is individually modulated to obtain pixel densities. Such a system, as described by U.S. Pat. No. 4,804,975, potentially has a low cost and high light efficiency. On the other hand, this type of system is susceptible to emitter failure, and the consequent introduction of a pattern error. It can also be difficult to properly modulate the diodes, due both to the high current inputs needed by the diodes and the sensitivity to thermal and electrical crosstalk effects between laser emitters.

As a hybrid approach, linear diode laser arrays are used as light sources without direct addressing, and the laser light from the multitude of emitters is subsequently combined to flood illuminate a linear spatial light modulator array. In many such systems, the lasing emitters provide single mode Gaussian light emission in the cross array direction, and spatially multi-mode emission in the array direction. A typical emitter might be ~100 $\mu$m in length in the array direction, and only ~3 $\mu$m wide in the cross array direction. The addressed pixels of the modulator array break up the light into image elements, and each pixel of the modulator is subsequently imaged onto the media plane to form the desired array of printing spots. Printing systems employing this approach are described by prior art patents U.S. Pat. No. 4,786,918 by Thornton et al., U.S. Pat. Nos. 5,517,359 by Gelbart, and 5,521,748 by Sarraf. A variety of linear spatial light modulators are appropriate for use in such systems, including the "TIR" modulator of U.S. Pat. No. 4,281,904 by Sprague, the grating light valve (GLV) modulator of U.S. Pat. No. 5,311,360 by Bloom et al., the electro-optic grating modulator of U.S. Pat. No. 6,084,626 by Ramanujan et al., and the conformal grating modulator of U.S. Pat. No. 6,307,663 by Kowarz. Certainly numerous other modulator array technologies have been developed, including most prominently the digital mirror device (DMD) and liquid crystal displays (LCDs), but these devices are less optimal as linear array modulators which experience the high incident power levels needed in many printing and display applications.

In such systems, it is important that the illumination provided to the modulator plane be as uniform as possible. To begin with, if the emitted light is spatially and temporally coherent from one emitter to the next, the overlapped illumination at the modulator can suffer variation from interference fringes. Even with laser array consisting of long 1-D multimode emitters, laser filamentation, residual coherence, and non-uniform gain profiles can cause significant macro- and micro- non-uniformities in the array direction light emission profiles, which can result in the modulator illumination being significantly non-uniform. These issues have been addressed by a variety of methods.

As an example, U.S. Pat. No. 4,786,918 provides a laser diode array in which alternating single mode laser emitters are offset in one of two rows, so that the emitters are uncoupled and mutually incoherent. The emitted light subsequently overlaps in the far field, without any assistance from light homogenizing optics, to provide a substantially Gaussian light profile without interference.

In contrast, prior art U.S. Pat. Nos. 5,517,359 and 5,521,748 both utilize linear laser diode array consisting of broad area emitters. These high power laser arrays used in these systems typically emit 20–30 Watts of near infrared light, at wavelengths in the 810–950 nm range, with emission bandwidths of 3–4 nm. In both of these systems, the laser emitters are imaged directly, in an overlapping fashion, with the assistance of a lenslet array, onto the modulator array at a high magnification. As the array direction light emission profile for each of these emitters suffers a light fall off at the ends of the emitters, the system of U.S. Pat. No. 5,517,359 provides a mirror system to partially compensate for these problems, by substantially removing the macro-nonuniformities, but at the cost of some reduced brightness due to the increased angular spread of the illumination to the modulator. The method of U.S. Pat. No. 5,517,359 also only works well when the light profile across the emitting elements already has large areas that are substantially uniform.

A variety of systems have been disclosed for improving the illumination uniformity provided to the spatial light modulator array from the laser array. In particular, U.S. Pat. No. 5,923,475 by Kurtz et al. describes systems where a fly's eye integrator is used to homogenize the array direction illumination incident to the modulator array. Similarly, U.S. Pat. No. 6,137,631 by Moulin utilizes an integrating bar to homogenize the light.

As these laser diode arrays also typically suffer from "laser smile", which is a cross array deviation of the emitter location from co-linearity (typical total deviation is 10 $\mu$m or less), cross array optics have been developed to correct for this problem. A variety of smile correction methods are described in prior art patents U.S. Pat. No. 5,854,651 by Kessler et al., U.S. Pat. No. 5,861,992 by Gelbart, and U.S. Pat. No. 6,166,759 by Blanding. Laser diode array bars have also been stacked in the cross array direction, with the goal of increasing the incident light available to the target plane. Exemplary laser beam shaping optics designed for stacked laser arrays are described in prior art patents U.S. Pat. No. 6,215,598 by Hwu and U.S. Pat. No. 6,240,116 by Lang et al.

Numerous color laser printers, with color lasers or infrared lasers and false color media, have been developed. In general, the most thoroughly developed architecture for color laser printing utilizes co-aligned beams in a flying spot printer. Exemplary prior art patents include U.S. Pat. No. 4,728,965 to Kessler et al. and U.S. Pat. No. 4,982,206, also to Kessler et al.

However, the visible color laser systems used both in display and printing applications have under utilized this very effective architecture of having a laser diode array flood illuminate a spatial light modulator array, with or without intervening light uniformizing optics. The system described in U.S. Pat. No. 5,982,553 by Bloom et al. utilizes solid state lasers (red, green, and blue) to illuminate a spatial light modulator array, which is turn imaged and scanned across a screen. As with the comparable laser printing systems, U.S. Pat. No. 5,982,553 system relies on a single laser source (for each color), and is thus sensitive to the failure of that laser source.

In the prior art patents U.S. Pat. No. 5,614,961 by Gibeau et al. and U.S. Pat. No. 5,990,983 by Hargis et al., color laser arrays are directly modulated and scanned across the screen. Thus, these systems do not utilize a system architecture which flood illuminates a spatial light modulator array, and thus the systems lack laser redundancy, and they too are sensitive to laser emitter failure. Additionally, the color laser arrays described by U.S. Pat. Nos. 5,614,961 and 5,990,983 are costly and difficult to fabricate. Because the laser arrays rely on inorganic semiconductor or solid-state laser media which do not emit light directly in the blue (440–470 nm) and green (520–550 nm) regions of the spectrum, nonlinear optics are required to frequency double the light emission to the desired wavelengths. Reliable lasers based on the nitride system that emit sufficient power directly in the blue and green spectral regions do not appear to be available in the near future. For the present, the nonlinear optics increase the cost and complexity of the laser arrays, and also reduce the efficiency of the laser system. Furthermore, the requirement to directly modulate the laser arrays in U.S. Pat. Nos. 5,614,961 and 5,990,983 necessitates the inclusion of an external modulating element to each emitter in the laser arrays to avoid chirp in semiconductor laser systems or limits due to the long upper state lifetime in solid-state laser systems.

Therefore, it can be seen that a laser projection display system using the optical system architecture combining a laser diode array with a flood illuminated spatial light modulator array would be advantaged. Moreover, it can be seen that improved, robust, low cost, color laser diode arrays would be advantaged over the existing color laser arrays, and would in turn further advantage this same optical system architecture.

One new laser technology that could be particularly advantaged for providing visible wavelength laser arrays, which could be useful both for projection and display, is the organic vertical cavity laser.

Vertical cavity surface emitting lasers (VCSELs) based on inorganic semiconductors (e.g. AlGaAs) are more commonly known than are the newer, organically based lasers. Inorganic VCSELs have been developed since the mid-80's ("Circular Buried Heterostructure (CBH) GaAl As/GaAs Surface Emitting Lasers" by K. Kinoshita et al., IEEE J. Quant. Electron. QE-23, pp. 882–888 (1987)), and they have reached the point where AlGaAs-based VCSELs emitting at 850 nm are manufactured by a number of companies and have lifetimes beyond 100 years. With the success of these near-infrared lasers, attention in recent years has turned to using inorganic material systems to produce VCSELs emitting in the visible wavelength range, but despite significant efforts worldwide, much work remains to create viable inorganic laser diodes spanning the visible spectrum.

In an effort to produce visible wavelength VCSELs it would be advantageous to abandon inorganic-based systems and focus on organic-based laser systems, since organic-based gain materials may have a number of advantages over inorganic-based gain materials in the visible spectrum. For example, typical organic-based gain materials have the properties of low unpumped scattering/absorption losses and high quantum efficiencies. In comparison to inorganic laser systems, organic lasers should be relatively inexpensive to manufacture, can be made to emit over the entire visible range, can be scaled to arbitrary size and, most importantly, are able to emit multiple wavelengths (such as red, green, and blue) from a single chip.

Given this potential, interest in making organic-based solid-state lasers is increasing. In the efforts to date, the laser gain material has been either polymeric or small molecule, with these materials utilized in a variety of resonant cavity structures. The exemplary cavity structures used have included micro-cavity structures (U.S. Pat. No. 6,160,828 by Kozlov et al.), waveguide structures, ring micro-lasers, and distributed feedback structures (U.S. Pat. No. 5,881,083 by Diaz-Garcia et al.). Notably, these new devices have all used a laser pump source to excite the organic laser cavities. Electrical pumping is generally preferred, as the laser cavities are more compact and easier to modulate.

A main barrier to achieving electrically-pumped organic lasers is the small carrier mobility of the organic material, which is typically on the order of $10^{-5}$ cm$^2$/(V–s). This low carrier mobility results in a number of problems. Devices with low carrier mobilities are typically restricted to using thin layers in order to avoid large voltage drops and ohmic heating. These thin layers result in the lasing mode penetrating into the lossy cathode and anode, which causes a large increase in the lasing threshold ("Study of lasing action based on Förster energy transfer in optically pumped organic semiconductor thin films" by V. G. Kozlov et al., J. Appl. Phys. 84, pp. 4096–4106 (1998)). Since electron-hole recombination in organic materials is governed by Langevin recombination (whose rate scales as the carrier mobility), low carrier mobilities result in orders of magnitude more charge carriers than singlet excitons. One consequence of this is that charge-induced (polaron) absorption can become a significant loss mechanism. Assuming laser devices have a 5% internal quantum efficiency, while using the lowest reported lasing threshold to date of ~00 W/cm$^2$ ("Light amplification in organic thin films using cascade energy transfer" by M. Berggren et al., Nature 389, pp. 466–469 (1997)), and ignoring the above mentioned loss mechanisms, would put a lower limit on the electrically-pumped lasing threshold of only 1000 A/cm$^2$. Including these loss mechanisms would place the lasing threshold well above 1000 A/cm$^2$, which to date is the highest reported current density, which can be supported by organic devices ("High Peak Brightness Polymer Light-Emitting Diodes" by N. Tessler, Adv. Mater. 19, pp. 64–69 (1998)).

One way to avoid some of the problems affecting electrical pumping of organic laser devices is to use crystalline organic material instead of amorphous organic material as the lasing media. For example, an organic laser, comprising a thick layer single crystal tetracene gain material and a Fabry-Perot resonator, has demonstrated room temperature laser threshold current densities of approximately 1500 A/cm$^2$.

However, it would be preferable to fabricate organic-based lasers with amorphous layers instead of crystalline layers (either inorganic or organic materials), as the manufacturing costs are significantly reduced. Furthermore, amorphous organic lasers can more readily be fabricated over large areas, as compared to producing large regions of single crystalline material. Additionally, because of their amorphous nature, organic-based lasers can be grown on a wide variety of substrates; thus, materials such as glass, flexible plastics, and Si are possible supports for these devices. In combination, the amorphous organic laser has the potential to be scalable to arbitrary size (resulting in greater output powers) and arbitrary shape.

Optical pumping of amorphous organic lasers provides the significant advantage that the lasing structure is no longer impacted by the problems experienced by electrical pumping. The organic lasers can be pumped not only by exterior laser sources, but also incoherent light sources, such as light emitting diodes (LEDs) and lamps. For example, the combinations of using an organic DFB laser with inorganic LEDs ("Semiconducting polymer distributed feedback lasers" by M. D. McGehee et al. Appl. Phys. Lett. 72, pp. 1536–1538 (1998)) or organic waveguide lasers with organic LEDs (U.S. Pat. No. 5,881,089 by Berggren et al.) have been described. Optical pumping of organic laser systems is enabled by the fact that scattering and absorption losses (~0.5 cm$^{-1}$) at the lasing wavelength are greatly reduced, especially when one employs a host-dopant combination as the active media. Even taking advantage of these small losses, the smallest reported optically-pumped threshold for organic lasers to date is 100 W/cm$^2$, in a device using a waveguide laser design ("Light amplification in organic thin films using cascade energy transfer" by M. Berggren et al., Nature 389, pp. 466–469 (1997)). Since off-the-shelf inorganic LEDs can only provide up to ~20 W/cm$^2$ of power density, a different device architecture is required to achieve optical pumping with incoherent sources, particularly with LEDs. In order to lower the lasing threshold additionally, it is necessary to choose a laser structure that minimizes the gain volume; and a VCSEL-based microcavity laser satisfies this criterion. Using VCSEL-based organic laser cavities should enable optically-pumped power density thresholds below 5 W/cm$^2$. As a result practical organic laser devices can be driven by optically pumping then with a variety of readily available, incoherent light sources, such as LEDs.

There are a few disadvantages to organic-based gain media, but with careful laser system design these can be overcome. Organic materials can suffer from low optical and thermal damage thresholds. Devices will have a limited pump power density in order to preclude irreversible damage to the device. Organic materials additionally are sensitive to a variety of environmental factors like oxygen and water vapor; efforts to reduce sensitivity to these variables typically result in increased device lifetime.

In general, the field of organic lasers has not been fully developed. Moreover, the favorable laser architecture of amorphous organic materials, vertical micro-cavity structures, and optical pumping with either coherent or incoherent light sources, has likewise not been fully developed. In particular, the extension of the optically pumped organic vertical cavity laser into configurations favorable for various systems applications has not occurred. As organic lasers, can be fabricated by high-vacuum thermal evaporation methods, using masks and photo-resists for patterning, a wide variety of laser structures, including laser array structures can be created. It may also be possible to fabricate organic lasers in part by utilizing printing methods (as is done with organic LEDs), such as ink jet or laser thermal deposition. As a result, the organic laser structures can be optimized in new and unique ways to match the specific intended applications, such as printing and display.

SUMMARY OF THE INVENTION

An organic vertical cavity laser light producing device comprises a substrate. A plurality of laser emitters emits laser light in a direction orthogonal to the substrate. Each laser emitter within the plurality of laser emitters has a first lateral mode structure in a first axis orthogonal to the laser light direction and has a second lateral mode structure in a second axis orthogonal to both the laser light direction and the first axis. Each laser emitter comprises a first mirror provided on a top surface of the substrate and is reflective to light over a predetermined range of wavelengths. An organic active region produces laser light. A second mirror is provided above the organic active region and is reflective to light over a predetermined range of wavelengths. A pumping means excites the plurality of laser emitters.

The invention and its objects and advantages will become more apparent in the detailed description of the preferred embodiment presented below.

BRIEF DESCRIPTION OF THE DRAWINGS

FIGS. 7a–7i depict basic modulation optical systems employing the organic vertical cavity laser array utilized in combination with spatial light modulator arrays, with different architectures for illuminating the organic vertical cavity laser array.

FIG. 8a depicts an alternate configuration for a modulation optical system employing an organic vertical cavity laser array utilized in combination with an illumination modulator to provide color sequential operation.

DETAILED DESCRIPTION OF THE INVENTION

Figure 1:
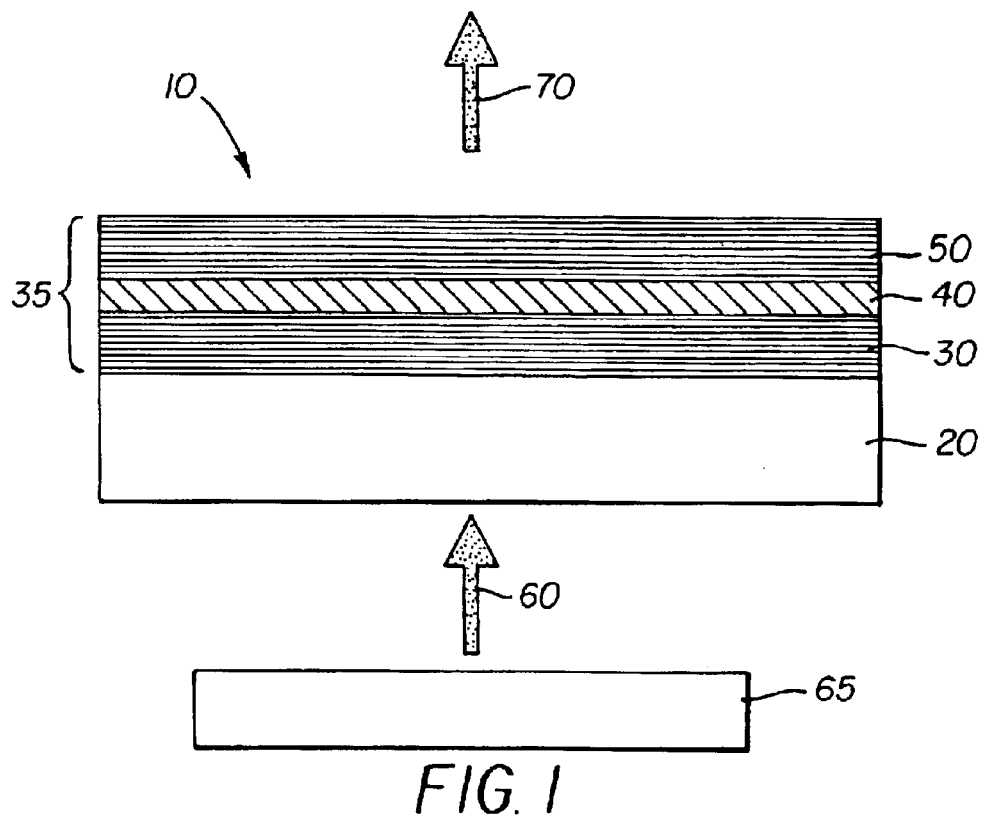
FIG. 1 is a cross-sectional view of the structure of a vertical cavity organic laser.

A schematic of a vertical cavity organic laser structure 10 is shown in FIG. 1. The substrate 20 can either be light transmissive or opaque, depending on the intended direction of optical pumping and laser emission. Light transmissive substrates 20 may be transparent glass, plastic, or other transparent materials such as sapphire. Alternatively, opaque substrates including, but not limited to, semiconductor material (e.g. silicon) or ceramic material may be used in the case where both optical pumping and emission occur through the same surface. On the substrate is deposited a bottom dielectric stack 30 followed by an organic active region 40. A top dielectric stack 50 is then deposited. The organic laser film structure 35 comprises the combination of the bottom dielectric stack 30, the organic active region 40, and the top dielectric stack 50. A pump light source 65 provides a pump beam 60 that optically pumps the vertical cavity organic laser structure 10. The source of the pump beam 60 may be incoherent, such as emission from a light emitting diode (LED). Alternatively, the pump beam may originate from a coherent laser source. FIG. 1 shows laser emission 70 from the top dielectric stack 50. Alternatively, the laser structure could be optically pumped through the top dielectric stack 50 with the laser emission through the substrate 20 by proper design of the dielectric stack reflectivities. In the case of an opaque substrate, such as silicon, both optical pumping and laser emission occur through the top dielectric stack 50.

The preferred material for the organic active region 40 is a small-molecular weight organic host-dopant combination that is typically organically grown/deposited by high-vacuum thermal evaporation. These host-dopant combinations are advantageous since they result in very small un-pumped scattering/absorption losses for the gain media. It is preferred that the organic molecules be of small-molecular weight, since vacuum-deposited materials can be deposited more uniformly than spin-coated polymeric materials. It is also preferred that the host materials used in the present invention are selected such that they have sufficient absorption of the pump beam 60 and are able to transfer a large percentage of their excitation energy to a dopant material via Förster energy transfer. Those skilled in the art are familiar with the concept of Förster energy transfer, which involves a radiation-less transfer of energy between the host and dopant molecules. An example of a useful host-dopant combination for red-emitting lasers is aluminum tris (8-hydroxyquinoline) (Alq) as the host and [4-(dicyanomethylene)-2-t-butyl-6-(1,1,7,7-tetramethyljulolidyl-9-enyl)-4H-pyran] (DCJTB) as the dopant (at a volume fraction of 1%). Other host-dopant combinations can be used for other wavelength emissions. For example, in the green a useful combination is Alq as the host and [10-(2-benzothiazolyl)-2,3,6,7-tetrahydro-1,1,7,7-tetramethyl-1H,5H,11H-[1]Benzopyrano[6,7,8-ij]quinolizin-11-one] (C545T) as the dopant (at a volume fraction of 0.5%). Other organic gain region materials can be polymeric substances, e.g., polyphenylenevinylene derivatives, dialkoxy-polyphenylenevinylenes, poly-paraphenylene derivatives, and polyfluorene derivatives, as taught by Wolk et al. in commonly assigned U.S. Pat. No. 6,194,119.

The bottom and top dielectric stacks 30 and 50, respectively, are preferably deposited by conventional electron-beam deposition and can comprise alternating high index and low index dielectric materials, such as, $TiO_2$ and $SiO_2$, respectively. Other materials, such as $Ta_2O_5$ for the high index layers, could be used. The bottom dielectric stack 30 is deposited at a temperature of approximately 240° C. During the top dielectric stack 50 deposition process, the temperature is maintained at around 70° C. to avoid melting the organic active materials. In an alternative embodiment of the present invention, the top dielectric stack is replaced by the deposition of a reflective metal mirror layer. Typical metals are silver or aluminum, which have reflectivities in excess of 90%. In this alternative embodiment, both the pump beam 60 and the laser emission 70 would proceed through the substrate 20. Both the bottom dielectric stack 30 and the top dielectric stack 50 are reflective to laser light over a predetermined range of wavelengths, in accordance with the desired emission wavelength of the vertical cavity organic laser structure 10.

The use of a vertical microcavity with very high finesse allows a lasing transition at a very low threshold (below 0.1 $W/cm^2$ power density). This low threshold enables incoherent optical sources to be used for the pumping instead of the focused output of laser diodes, which is conventionally used in other laser systems. An example of a pump source is a UV LED, or an array of UV LEDs, e.g. from Cree (specifically, the XBRIGHT® 900 UltraViolet Power Chip ® LEDs). These sources emit light centered near 405 nm wavelength and are known to produce power densities on the order of 20 $W/cm^2$ in chip form. Thus, even taking into account limitations in utilization efficiency due to device packaging and the extended angular emission profile of the LEDs, the LED brightness is sufficient to pump the laser cavity at a level many times above the lasing threshold.

Figure 2:
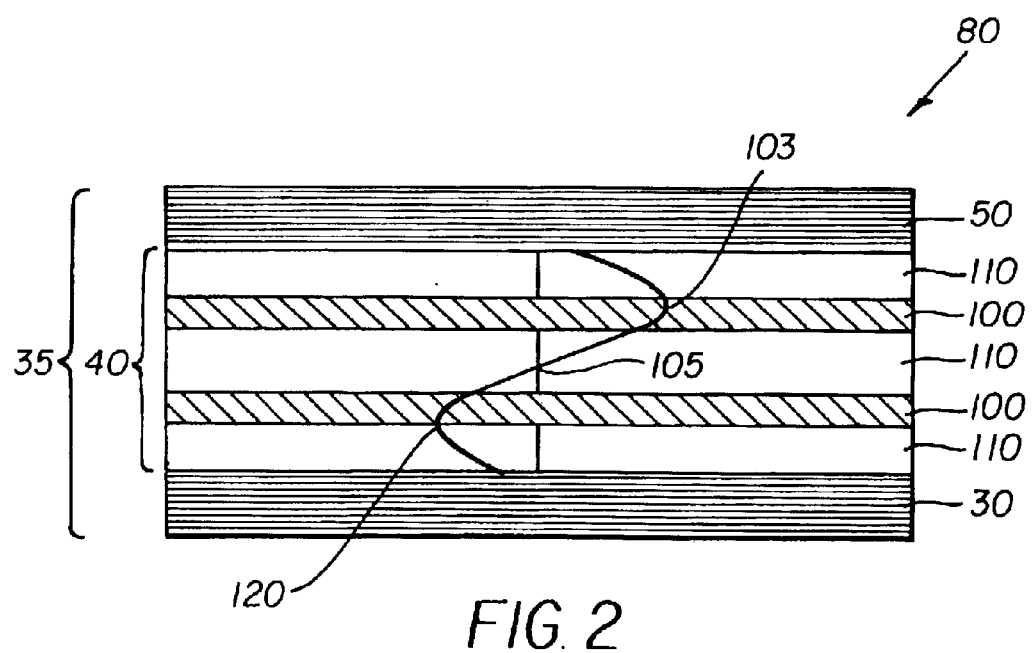
FIG. 2 is a cross-sectional view of the structure of a vertical cavity organic laser with improved efficiency of operation.

The efficiency of the laser is improved further using an active region design as depicted in FIG. 2 for the vertical cavity organic laser structure 80. The organic active region 40 includes one or more periodic gain regions 100 and organic spacer layers 110 disposed on either side of the periodic gain regions and arranged so that the periodic gain regions are aligned with the anti-nodes 103 of the device's standing wave electromagnetic field. This is illustrated in FIG. 2 where the laser's standing electromagnetic field pattern 120 in the organic active region 40 is schematically drawn. Since stimulated emission is highest at the anti-nodes and negligible at the nodes 105 of the electromagnetic field, it is inherently advantageous to form the organic active region 40 as shown in FIG. 2. The organic spacer layers 110 do not undergo stimulated or spontaneous emission and largely do not absorb either the laser emission 70 or the pump beam 60 wavelengths. An example of an organic spacer layer 110 is the organic material 1,1-Bis-(4-bis(4-methyl-phenyl)-amino-phenyl)-cyclohexane (TAPC). TAPC works well as the spacer material since it largely does not absorb either the laser output or the pump beam energy and, in addition, its refractive index is slightly lower than that of most organic host materials. This refractive index difference is useful since it helps in maximizing the overlap between the electromagnetic field antinodes and the periodic gain region(s) 100. As will be discussed below with reference to the present invention, employing periodic gain region(s) instead of a bulk gain region results in higher power conversion efficiencies and a significant reduction of the unwanted spontaneous emission. The placement of the gain region(s) is determined by using the standard matrix method of optics ("Design of Fabry-Perot Surface-Emitting Lasers with a Periodic Gain Structure" by Corzine et al. IEEE J. Quant. Electr. 25, pp. 1513–1524 (1989)). To get good results, the thicknesses of the periodic gain region(s) 100 need to be at or below 50 nm in order to avoid unwanted spontaneous emission.

Figure 3:
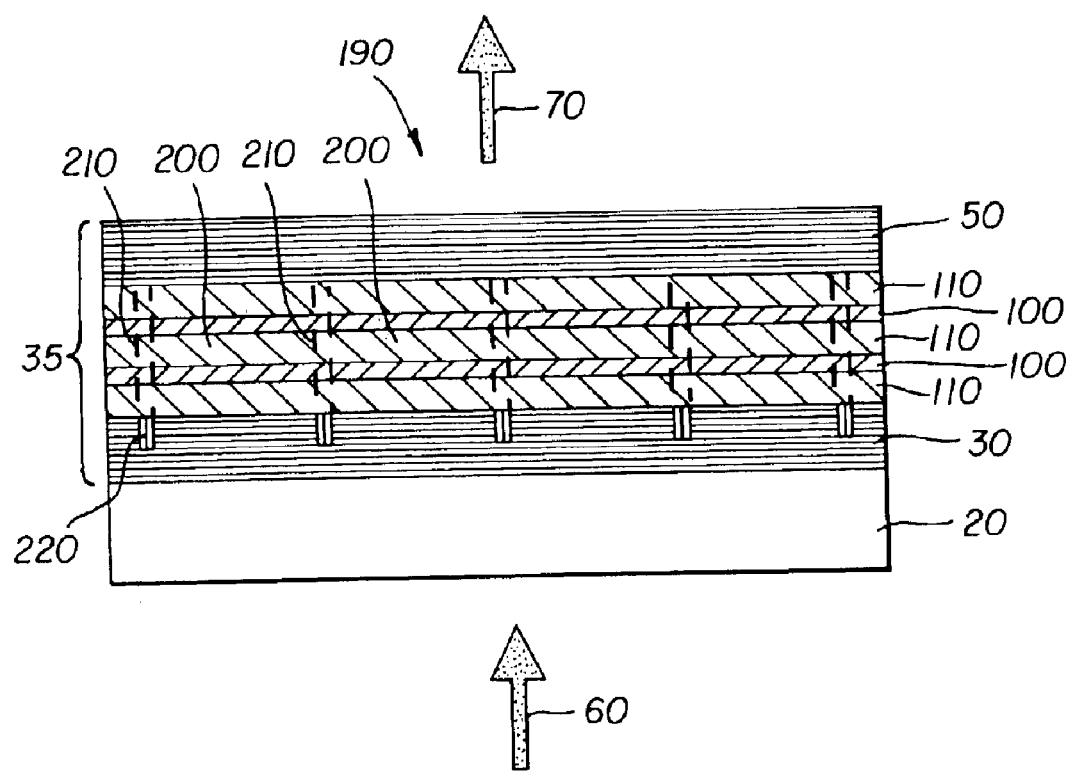
FIG. 3 is a cross-sectional view of the structure of a vertical cavity organic laser with phase locking across an array of laser emitters.

The laser can be increased in area while maintaining a degree of spatial coherence by utilizing the phase-locked organic laser array 190 as depicted in FIG. 3. In order to form a two-dimensional phase-locked laser array 190, lasing emitters 200 separated by inter-emitter regions 210 need to be defined on the surface of the VCSEL. Laser emitters are created by weakly confining the laser light to emitter regions by either small amounts of built-in index or gain guiding, or by modulating the reflectance of at least one of the mirrors. In the preferred embodiment the reflectance modulation is affected by patterning and forming an etched region 220 in the bottom dielectric stack 30, using standard photolithographic and etching techniques, thus forming a two-dimensional array of circular pillars on the surface of the bottom dielectric stack 30. The remainder of the organic laser microcavity structure is deposited upon the patterned bottom dielectric stack 30 as described above.

The dimensions of the laser emitters are critical for determining the lateral modes supported by the laser emitters. For the case of an index-guided structures, the number of lateral modes supported is dictated by well-known rules governing optical waveguides (reference: "Theory of Dielectric Waveguides" by H. Kogelnik, Chapter 2 of "Integrated Optics", Ed. by T. Tamir, Springer-Verlag, 1979, pp. 13–81). For gain-guided structures, the number of lateral modes supported is dictated by the degree of overlap between the supported cavity modes and the gain profile. For reflectance-modulated structures, the number of lateral modes supported is determined by the dimensions of the mirror structure, related to the diffraction loss experienced by a given mode (reference: "Resonant modes in a maser interferometer"; Bell Sys. Tech. J, Vol. 40, pages 453–458, March 1961, by A. Fox and T. Li). Depending on the guiding structure, a critical dimension exists, below which only a single transverse mode is supported, and above which a plurality of transverse modes are supported. These principles apply to laser systems in general, and are not specific to an organic laser structure.

To obtain phase locking, intensity and phase information must be exchanged amongst the lasing emitters 200. To accomplish this, the inter-emitter spacing, edge to edge, should be in the range of 0.25 to 4 μm. Phase-locked array operation also occurs for larger inter-emitter spacings; however, it leads to inefficient usage of the optical-pumping energy. Generally, for inter-emitter spacings that have emitter edge to emitter edge distances greater than ~10 nm coherent coupling will be provided. The etch depth is preferred to be from 200 to 1000 nm deep to form etched region 220. By etching just beyond an odd number of layers into the bottom dielectric stack 30, it is possible to affect a significant shift of the longitudinal mode wavelength in the etched region away from the peak of the gain media. Hence, lasing action is prevented and spontaneous emission is significantly reduced in the inter-emitter regions 210. The end result of the formation of etched region 220 is that the laser emission is weakly confined to the laser emitters 200, no lasing originates from the inter-emitter regions 210, and coherent phase-locked laser light is emitted by the phase-locked organic laser array 190.

One other advantage of the organic VCSEL structures is that they can be easily fabricated into arrays of individually-addressable elements. In such arrays, each element would be incoherent with neighboring elements and pumped by a separate pump source (e.g. LED or group of LEDs). The arrays could either be one-dimensional (linear) or two-dimensional (area) depending on the requirements of the application. The elements in the array can also comprise multiple host-donor combinations and/or multiple cavity designs such that a number of wavelengths could be produced by a single array.

The organic gain materials of the present invention exhibit extremely large gain bandwidths compared with conventional laser materials. For example, Alq doped with the dopant DCM has been reported to have a gain bandwidth exceeding 100 nm (see S. Reichel et al, Very compact tunable solid-state laser utilizing a thin-film organic semiconductor, Optics Letters Vol. 26, No. 9, pp. 593–595 (2001)). Therefore, the possibility exists of producing lasers with a wide range of wavelengths using the same host-dopant combination. Within an organic laser array of VCSEL elements having the same host-dopant combination, the laser wavelength can be varied between laser emitters by, for example, controllably varying the thickness of the active region. Because the longitudinal laser modes have wavelengths that are proportional to the cavity length, varying the active region thickness produces a laser wavelength that varies across the elements.

Figure 4A:
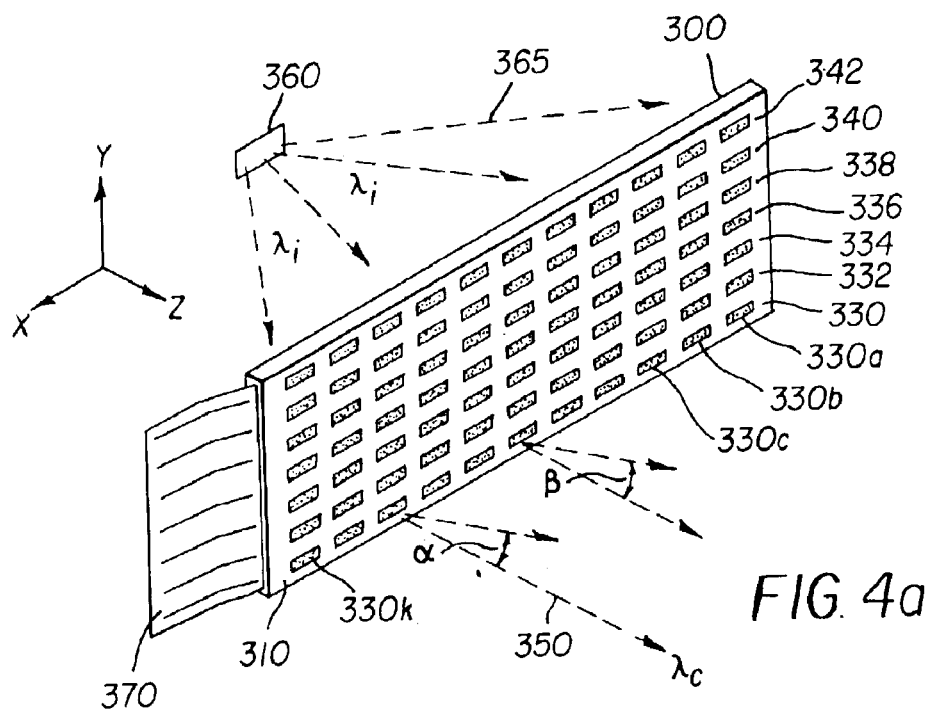
FIG. 4a depicts a perspective view of the organic vertical cavity laser array of the present invention.
Figure 4B:
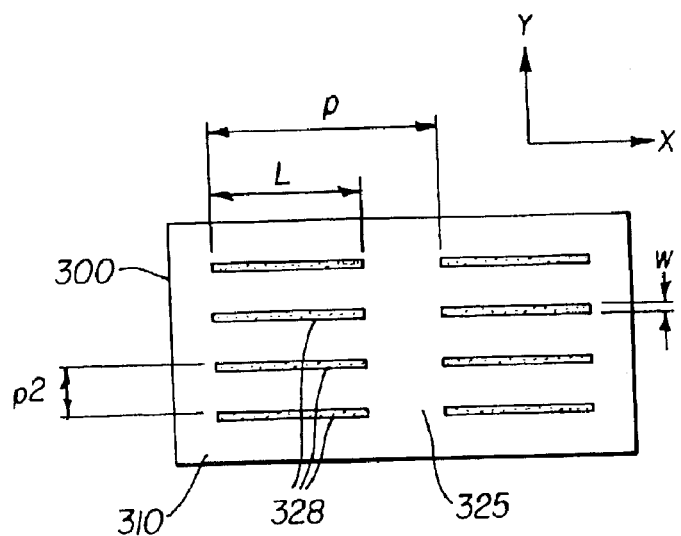
FIG. 4b depicts an expanded frontal view of a portion of the organic vertical cavity laser emitters within a laser array of the present invention.

The specific organic vertical cavity laser array 300 provided by the present invention is depicted in FIG. 4a, and in greater detail in FIG. 4b. In the preferred embodiment of the present invention, each of the individual laser emitters 330 of this laser array have a linear configuration, with multi-mode lasing behavior in the long axis (X) of the emitter, and single mode Gaussian lasing behavior in the short axis (Y) of the emitter. The laser emitters are arranged to form a monolithic organic laser array, such that representative row 330 comprises multiple emitters 330a, 330b, 330c, . . . 330k, and row 330 extends along the X axis, such that the long dimension of the emitters is in the same axis as the long dimension of the row. The organic laser array 300 can also comprise multiple parallel rows of laser emitters, such as the rows 330, 332, 334, . . . 342, that are depicted in FIG. 4a. The general purpose and value of the organic laser array 300 can be understood by considering FIG. 5, where an imaging system 400 includes a modulation optical system 410 that encompasses an organic laser array (300), as well as a linear spatial light modulator array 460, and various intermediate beam shaping optics. As the difficulty of the design and implementation of imaging system 400 is significantly determined by the operational and structural characteristics of the laser light source, improvements in the laser sources can have significant impact. The organic laser array 300 of the present invention provides opportunities both to improve the design and operation of imaging system 400, and to provide new capabilities and features for that system.

Figure 5:
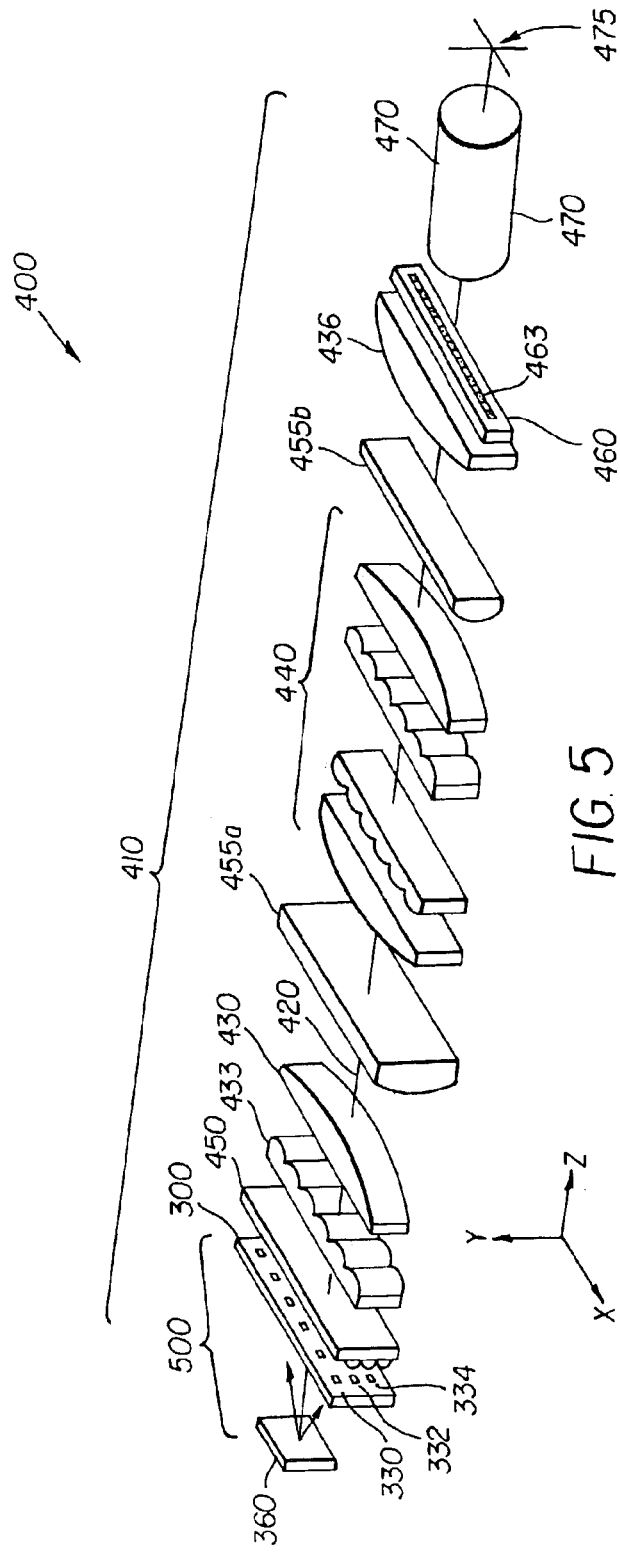
FIG. 5 depicts an imaging system utilizing an organic vertical cavity laser array of the present invention, wherein the laser array is used in combination with a linear spatial light modulator array.

In particular, the imaging system 400 of FIG. 5 is quite similar to the laser thermal printing system described in U.S. Pat. No. 5,923,475 by Kurtz et al. In that system, the equivalent laser array to the organic laser array 300 is an array of infrared (IR) laser emitters nominally operating at ~810 nm, where the emitters may be 100–150 μm in length in the X direction, and <1 μm in height in the Y direction. Due to power density issues in semiconductor laser arrays (particularly high power arrays), the laser emitters are typically spaced on a pitch much larger than the emitter length (500–650 μm for example). In the infrared laser thermal system, light in the array direction (X) is used to flood illuminate a modulator array (460), with a fly's eye integrator (440) providing light homogenization, and with the laser emitters (330) conjugate to the spatial light modulator. Array field lens 436 can be used to make the illumination telecentric to the modulator array 460, or alternately, to image the fly's eye integrator into the pupil of the imaging lens 470. Unlike the laser array depicted in FIG. 5, the infrared laser array shown in U.S. Pat. No. 5,923,475 is a semiconductor device providing only a single row of laser emitters. Generally speaking, it is very difficult to create a multiple row semi-conductor laser array (U.S. Pat. No. 4,803,691 by Scifres et al. provides an example of one), and multiple row arrays are generally only provided by stacking laser arrays, or by coupling multiple lasers to a multi-row optical fiber array. Such multi-row structures are costly, mechanically complicated, and may be significantly limited in terms of the minimum pitch possible between adjacent rows.

Semiconductor laser arrays also typically suffer from a manufacturing problem known as "smile", where the emitter positions along the row vary from co-linearity in the Y direction. As smile error impacts the cross array beam size at the modulator array, with a possible impact on light efficiency or modulation performance, a combination of optical and mechanical methods have been developed to correct for this problem, including those described in U.S. Pat. Nos. 5,854,651 by Kessler et al. and U.S. Pat. No. 6,166,759 by Blanding.

As compared to the semiconductor laser arrays, including the infrared laser arrays used in thermal printing, the organic laser array 300 offers several potential advantages to an imaging system 400. To begin with, organic lasers can provide visible wavelength laser light over much of the visible spectrum, whereas, by comparison, semiconductor lasers have been limited to particular red and blue lasing wavelengths. Moreover, as organic lasers can be fabricated readily, using pattern printing techniques, it is relatively easy to create multi-row arrays, with the laser emitters within each of the rows placed with high accuracy (negligible smile error). Additionally, the lasing wavelengths can be readily varied across the organic laser array in a deliberate manner. Organic laser arrays have these and other significant advantages over semiconductor laser arrays, which in turn provide both advantages and new capabilities to an imaging system 400 constructed with these organic laser arrays.

This can be better understood by considering the organic laser array 300 depicted in FIGS. 4a and 4b in greater detail. Organic laser array 300 comprises a multitude of rows (330 through 342) of laser emitters (such as 330a through 330k) fabricated on a single monolithic substrate 310. As shown in detail in FIG. 4b, which depicts a portion of an organic laser array 300, the generalized laser emitters 328 have a length (L), a width (w), a pitch (p) between emitters within a row, where the length (L) is less than the pitch (p), thereby leaving a gap 325. Likewise, there is a pitch (p2) between rows of laser emitters. In FIG. 4b, the laser emitters 328 are referred to as "generalized" so that the organic laser array 300 can be described in broadest terms, as compared to the description of the organic laser array 300 and the laser emitters 330a, 330b, 332a, etc., accompanying the discussion of FIG. 4a throughout this patent, for which many design variations are considered.

Preferably, the organic laser array 300 is optically pumped, using back illumination from an external light source. In FIG. 4a, this is shown simply with light source 360 providing illumination light 365 of wavelength(s) $\lambda_i$, and organic laser array 300 emitting laser light 350 of wavelength $\lambda_c$. The illumination light 365 is transmitted through the substrate 310, which is preferably optically transparent, to provide pump light to the organic laser emitters populating the organic laser array 300. For example, light source 360 may be an incoherent light source such as an LED, which emits light λi from ~380 to ~420 nm, while the organic laser emitters can be generally be constructed to emit light across most of the visible spectrum, with a given laser emitter providing output light at a set lasing wavelength λc with a limited bandwidth (for example at 532 nm with a +/−0.5 nm bandwidth). As will be discussed in great detail later, the illumination light 365 can be prepared and optimized by a variety of different illumination optical systems.

Most simply, the organic laser array 300 could be constructed so that each emitter nominally emits light at the same wavelength (again such as 532 nm). However, as organic laser emitters can be constructed with considerable deliberate variation in lasing wavelength, and as these variations can be created in a deliberate manner across the laser array, the organic laser array 300 can be constructed to provide a great range of lasing wavelengths from a single monolithic substrate 310. For example, organic laser array 300 could be fabricated with an emitter pattern such that the first row of laser emitters 330 comprised laser emitters 330a–330k that operated at one given nominal wavelength (λc1), while the second row of laser emitters 332 could comprise laser emitters 332a–332k that operated at a second given nominal wavelength (λc2). For example, λc1 might be 532 nm, while λc2 might be 620 nm. Thus, organic laser array 300 could be constructed with each row having a different nominal lasing wavelength, or with groups of rows of laser emitters having the same or nearly the same nominal lasing wavelength, while other groups of rows of laser emitters on the same array 300 could have different wavelengths (from each other and from the first group). Likewise, the organic laser array 300 could be constructed so that the lasing wavelength is deliberately varied amongst the laser emitters within a given row. The ease with which the lasing wavelength can be deliberately varied across the organic laser array 300 is very advantageous in contrast to the difficulties encountered in attempting similar variations with semiconductor or solid-state laser arrays. As an example, U.S. Pat. No. 5,384,797 by Welch et al. describes a complex monolithic multi-wavelength laser diode array that includes an array of laser oscillators, coupled to an array of Bragg reflector gratings and then coupled both to a laser amplifier array and a frequency doubling waveguide array, to thereby provide a multi-wavelength laser array with less flexibility in layout and wavelength than is provided by the organic laser array 300. As will become apparent, certain configurations and combinations for varying the lasing wavelengths across an organic laser array 300 are particularly advantageous for the imaging systems considered in the present application.

It should be understood that the organic laser array 300 depicted in FIG. 4a is representative only, and that a device with 7 rows of emitters, each possessing just 11 laser emitters, is useful for explaining the concepts of this invention. For example, an actual device could be fabricated with laser emitters periodically spaced in an array over several cm² area. As a further example, if the rows are then spaced at a 10 μm period (p2), with each row having 150 μm wide (L) emitters spaced on a 250 μm pitch (p), a 3 cm by 3 cm organic laser array 300 would have ~360,000 laser emitters. At present, optically pumped organic laser arrays have demonstrated rather modest conversion efficiencies. In particular, patterned arrays have demonstrated ~10–20% conversion efficiency of the pump light (UV) into output laser light, while exhibiting a low damage threshold, relative to the power density of the pump light (<1 W/cm²). This means that an organic laser array with a 10 cm² area can accept ~10 Watts of input UV light from the pump source, to provide ~100 to 200 mw of visible wavelength output laser light from the laser array. Although these output power levels are modest, the ability to scale the output power with device area and also to select the visible spectra lasing wavelengths has significant potential for certain applications in image printing and projection.

Figure 6A:
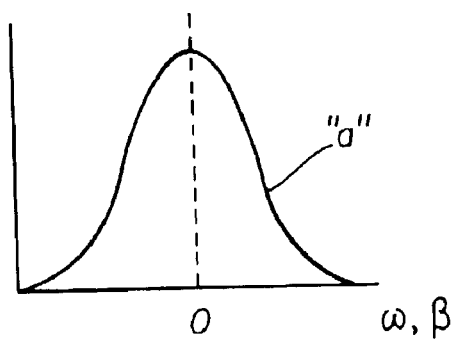
FIGS. 6a–6c are graphs with curves depicting the spatial and angular characteristics of the light that could be emitted by the laser emitters of the organic laser array of the present invention.
Figure 6B:
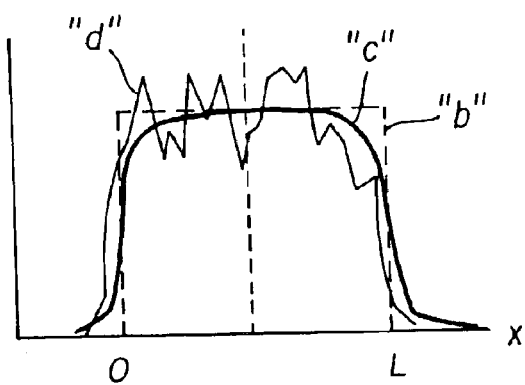
Figure 6C:
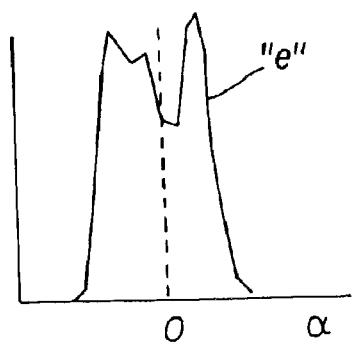

As shown in FIGS. 4a and 4b, the organic laser array 300 of the present invention preferentially comprises laser emitters 328 that are long (in X) and narrow (in Y) in construction. More preferentially, the generalized laser emitters 328 are multimode laser sources in X, and single mode laser sources in Y. To accomplish this, the generalized laser emitters 328 have a length (L) in X sufficiently large to support a plurality of lateral laser modes and a width (w) in Y sufficiently small to support only a single lateral laser mode. An exemplary laser emitter might have a "height" (w) in Y of ~2–5 microns, and a 100 μm "length" in X. The single mode emitted light is preferentially nominally Gaussian (with the $M^2$ parameter defining the beam quality), with a half angle beam width β, as illustrated in FIG. 6a, where curve "a" represents both the spatial (ω) and angular beam (β) profiles. When the generalized laser emitters 328 are single mode laser sources in the Y direction, the height (w) corresponds to twice the Gaussian beam waist radius (ω). The multi-mode emitted light has a half angle beam width α and angular and spatial beam profiles that are not Gaussian, but broad, and preferentially uniform until the edges are reached. Using general convention, the angular widths α and β both are defined to extend to the $1/e^2$ point (~13% power level) of the angular intensity profile (whether the profile is Gaussian in shape, or not). As shown in FIG. 6b, the spatial beam profile is ideally uniform (see curve "b") over the emitter length L, but a somewhat rounded profile (curve "c") can be acceptable. A noisy spatial beam profile (curve "d"), which can for example be caused by filamentation within the laser emitter, is much less desirable, although it also can be compensated for. The nominal multimode angular profile within the array direction beam width α is also preferentially uniform (like curve "b") but less uniform profiles are tolerable (curve "e" of FIG. 6c is an example).

The construction of the organic laser arrays 300 with the generalized laser emitters 328 being nominally long and narrow, and preferentially single mode in one dimension and multimode in the other, is motivated by the construction of the imaging system 400, as represented by FIG. 5, which employs a linear spatial light modulator array 460, and which provides a pixelated line of light to a target plane 475, in a manner that is particularly useful for image printing and image projection systems. The typical spatial light modulator array 460, comprises a line of electrically addressed pixels 463 (or modulator sites), where each pixel has a pre-determined array direction width and cross array height. For example, each pixel 463 might have a 40 μm width and 40 μm height. Preferentially, the modulator array is constructed with a high optical fill factor (0.9 or better), so that any gaps between adjacent pixels are minimal. Thus, for example, a linear modulator array with a single row of 2048 pixels would have an active area ~8.192 cm long, but only 40 μm wide.

For maximum light efficiency, the light illuminating the linear spatial light modulator array would match these dimensions, with minimal overfill (some overfill of the modulator by the illuminated area might be tolerated to assist the system alignment). Preferentially as well, the illumination light profile in the array direction (the long dimension of the modulator array) is uniform within a few percent. While electronic pattern correction can compensate for illumination pattern non-uniformity with offset or gain signals addressed to the individual pixels 463 of the modulator array 460, such corrections come at the cost of pixel luminance, contrast, or modulation bit depth. Thus, the imaging system 400 of FIG. 5 shows the array direction light emitted by the organic laser array 300 being optimized with a fly's eye integrator 440 to provide proper illumination of the modulator array 460. As will be discussed later, the pump light provided by the light source 360 can also be optimized, by means of an optical pumping illumination system 500, to provide proper illumination of the organic laser array 300 and thus potentially, of the modulator array 460. The system of FIG. 5 also provides a cross array lenslet array 450, as well as cross array lenses 455a and 455b, to control the cross array illumination to the modulator array 460 from the organic laser array 300. These cross array optics are designed to nominally fill the narrow direction of the modulator array 460, but otherwise the actual configuration depends on the properties of both the organic laser array 300 and the modulator array 460.

Generally it is preferable to illuminate the full length of the spatial light modulator array 460 in the array direction with light from every laser emitter in a row, rather than mapping the light from an emitter to a given portion of the modulator array. The illumination then has built in redundancy against the failure of one or more emitters. This however means that the laser emitters within a row (such as 330a, 330b, . . . ,330k) should be mutually incoherent in the array (X) direction, so that they can be overlapped without introducing significant interference fringes in the light profile at the modulator array. If then each of the laser emitters provides light of a uniform (or nearly so) profile (curve "b" of FIG. 6b), the light can be directed onto the modulator array without the benefit of homogenization optics. Alternately, if the emitted light profiles are non-uniform, but with random pattern of emitter light non-uniformity from one emitter to the next across the row of emitters, then the light from the emitters can potentially be overlapped to provide uniform illumination by averaging without the benefit of homogenization optics. If however, the emitter light profiles have pattern non-uniformity, such as a general fall-off at the emitter edges (such as curve "c" of FIG. 6b), then the fall-off will be replicated, although averaged, if the emitters are overlapped without the use of homogenization optics. If the falloff exceeds the tolerance for the application, the problem can be corrected by over-illuminating the modulator array or by the use of light homogenization optics (such as a fly's eye integrator or an integrating bar). As such light homogenization optics intermingle the light from a given emitter with itself, it is necessary that the emitted laser light from that emitter be multi-mode and sufficiently incoherent (or partially coherent) that overlapping can occur without again introducing significant interference fringes in the resulting illumination. On the other hand, some light coherence may be minimally required to obtain effective light modulation (for example, in the case of a diffractive modulator such as the GLV that uses Schlieren optics to do filtering in a Fourier plane). As a result, organic laser array 300 preferentially comprises at least one row of laser emitters, where the emitters are individually multimode and also phase de-coupled in the array (X) direction across the multitude of emitters. As will be discussed later, the creation of area laser arrays means that other combinations of phase decoupling or incoherence between emitters can be used.

As stated previously, in the cross array (Y) direction, it is generally preferable that laser emitters be narrow, so that the light can be coupled efficiently into the narrow line of pixels comprising the spatial light modulator array. Although the laser emitters can be multi-mode in the cross array direction, single mode Gaussian emission is generally preferred, as coherent Gaussian beams propagate more tightly than does incoherent light, which further assists light cross array light coupling into the modulator array. As before, it may be desirable that the laser emitters be phase de-coupled from one laser emitter to the next, to avoid any cross array direction interference effects, when light from multiple emitters is overlapped. Although light homogenization optics, such as a fly's eye integrator can be used to uniformize the cross array light, a light profile that falls off gradually (such as a Gaussian beam) can be beneficial for some applications. For example, in some printing applications, the tolerances on line placement, as related to printing artifacts such as contouring, are eased if the cross array light profile falls off gradually rather than abruptly. In the case of an imaging system 400 constructed with a 2D organic laser array 300, it may be preferable that the beams emitted from the multitude of emitters from the many rows 330, 332, 334, etc., be overlapped in the cross array direction at the modulator array as a multitude of superimposed non-interfering Gaussian beams.

Alternatively, for some linear spatial light modulator arrays, such as the grating light valve (GLV) or the conformal grating modulator, a nearly diffraction-limited laser beam is preferred in the scan direction. The present invention can accomplish this by phase-locking the emitters in the cross array (Y) direction. This is accomplished by reducing the pitch p2 in the narrow direction such that the circulating laser modes within neighboring emitters interact with each other and become coherently coupled. The phase-locked emitters will then emit light coherently in the cross array direction in a so-called "super mode." The super modes are identical to the transverse modes that are produced by conventional laser systems, and are well-known to those skilled in the art. The fundamental mode is a Gaussian diffraction-limited beam (in the cross-array direction) that can be focused on the spatial light modulator array without the necessity of overlapping the individual emitters. It should be noted that in phase locked laser arrays, higher order super modes, other than the fundamental Gaussian mode, are often dominant. These higher order super modes or multiple super modes can also be focused onto the spatial light modulator array, although interference fringes as described above are generally produced with multiple super modes. However, in many scanning applications, these are not visible in the final image because the scanning action washes out the interference fringes with fine pitch.

Figure 4C:
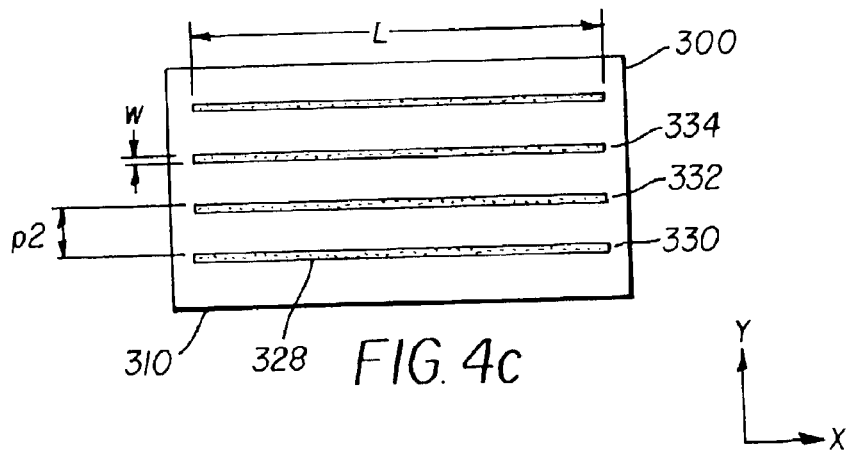
FIGS. 4c, 4d and 4e depict expanded frontal views of alternate embodiments of a portions of the organic vertical cavity laser emitters within an organic vertical cavity laser array of the present invention.
Figure 4D:
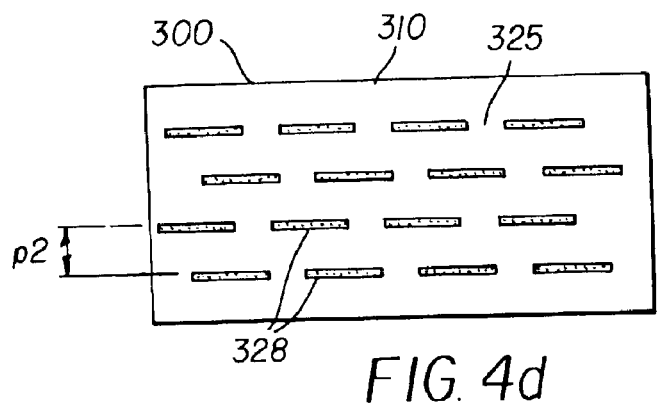
Figure 4E:
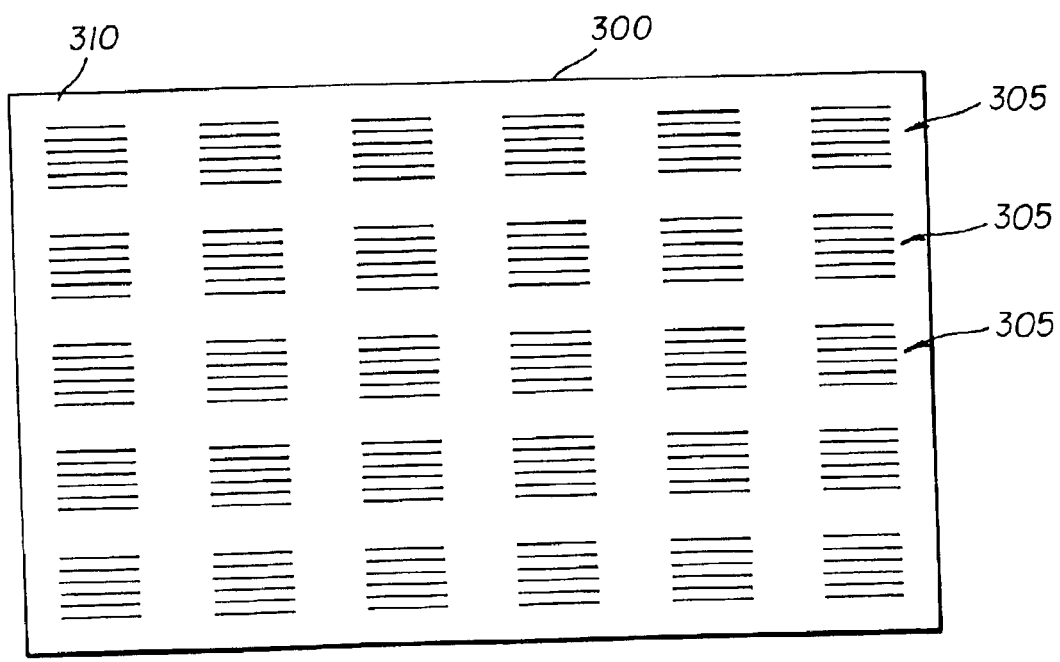

One advantage of phase-locking the emitters in the cross array (Y) direction is that it provides a much higher fill factor for laser emission, thereby yielding higher light output per unit area from the organic laser array 300. However, in practice the total area over which the laser emitters can be phase locked is limited by a variety of effects, including thermal gradients, material uniformity and pump uniformity. The two-dimensional organic laser array 300 in FIG. 4e shows an alternate embodiment with groups of phase-locked emitters 305 providing a high fill factor with high total light output. In effect, each emitter of organic laser array 300 is replaced by a group of phase-locked emitters 305. Advantageously, for the purposes of the applications and systems described in this application, organic laser array 300 could be constructed with a given group of phase-locked emitters 305, providing a laser super mode, having different light emission properties than a nearby or adjacent second group of phase locked emitters 305. For example, one group of phase locked emitters 305 could provide a super mode at one nominal laser wavelength (540 nm for example), while another group of phase locked emitters 305 provides a super mode at another nominal laser wavelength, which could be in the same color band (550 nm for example) or in another color band (625 nm for example).

The organic laser array 300 depicted in FIG. 4a is illuminated simplistically by a light source 360 that provides optical pump light to the laser array. Also, by means of electrical leads 370, FIG. 4a provides the alternative that organic laser array 300 could be electrically pumped rather than optically pumped, such that input electrical energy excites the organic gain media into a light emission, with the cavity structure then supporting lasing. However, as previously noted, for various reasons it is preferable to utilize optical pumping with organic laser arrays, such that light $\lambda i$ from the pump source excites the gain media into high light emitting energy states. There is however much more that can be done to optimize the illumination of the organic laser array 300 by light source 360, as well as the beam shaping of the emitted laser light $\lambda c$ that is directed onto the spatial light modulator array 460, and the design of the organic laser array 300, so as to fulfill the intention to provide an optimized imaging system 400. Towards that end, FIGS. 7a through 7h illustrate various configurations for modulation optical systems 410 that can be utilized advantageously to build imaging systems employing organic laser arrays 300.

Figure 7A:
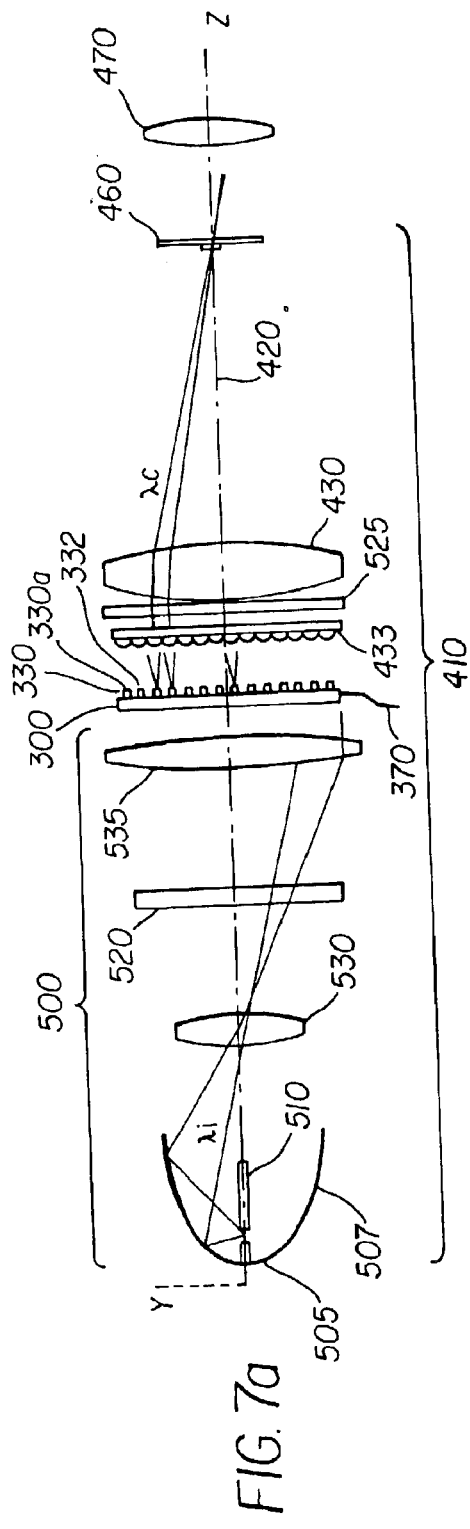

As compared to the imaging system 400 depicted in FIG. 5, FIG. 7a illustrates a cross sectional YZ plane view of a modulation optical system 410, showing the cross array direction illumination of spatial light modulator array 460. Thus, a single laser emitter (330a for example) from each row of laser emitters 330, 332, 334, etc., of the organic laser array 300 is depicted. The individual laser emitters each emit light, which is formed into a nominally collimated beam by a lenslet of combiner lenslet array 433. Combiner field lens 430 causes each of the collimated beams to be refocused at the spatial light modulator array 460, such that magnified images of each laser emitter are provided, which are overlapped onto each other, filling the narrow width (40 μm for example) of the modulator array. Although FIG. 7a does show an electrical lead 370 through which electrical pumping the organic laser array 300 could originate, greater detail is provided of an optical pumping illumination system 500 for the organic laser array 300, which includes a lamp 505, an illumination relay lens 530, and an illumination field lens 535.

In this configuration, lamp 505, which comprises electrodes 510 and a reflector 507 of elliptical profile, is generally an arc lamp. For example the lamp could be a high pressure xenon short arc lamp or a high pressure mercury short arc lamp, mounted in a surface of rotation reflector 507. Optical filter 520 eliminates source light outside the desired UV pump light spectral band. Another optical filter, leaky source filter 525, could be included in this system, after the organic laser array 300, to remove any residual pump light that has leaked through the laser array. The amount of leakage light will depend on both the optical conversion efficiency and the fill factor of the laser emitters 328 on the active area of the substrate 310 (per FIG. 4b). Although xenon sources could be used for optical pumping with UV and low blue spectrum light, as xenon lamps mostly emit visible and IR light, the optical efficiency would be very low. The emitted light, which is roughly focused by the elliptical reflector, is then collected by the condensing optics, comprising illumination relay lens 530 and an illumination field lens 535. These lenses nominally cause the organic laser array to be flood illuminated by telecentrically incident light.

In the prior discussions, the general properties of the organic laser array 300 of the present invention, as relates to the structure and beam properties of the individual laser emitters, and the entire laser array, have been discussed, as has the general combination of the laser array with an optical pumping illumination system (see FIG. 7a). But it has not yet been fully described how the two can be combined to provide a unique and advantaged imaging system. As one example, with FIG. 4a as a reference, an organic laser array 300 could be constructed where two rows of laser emitters, such as 330 and 332 for example, are designed to emit red light at a nominal wavelength of 630 nm. Likewise, the two rows of laser emitters 334 and 336 could emit green light at a nominal wavelength of 540 nm, while the two rows of laser emitters 338 and 340 could emit blue light at a nominal wavelength of 460 nm. Thus, the incoherent light emitted by a light source, which in the case of FIG. 7a is lamp 505, pumps an organic laser array 300, whose emitters then collectively provide laser light at various wavelengths in the visible spectrum. This laser light can then be optically combined to form a line of white laser light incident on spatial light modulator array 460. As the individual pixels 463 of spatial light modulator array 460 are addressed with control signals, and the spatial light modulator array 460 is imaged to a target plane by an imaging lens 470, a modulated line of white laser light can provided at a target plane. If the system further included a scanner (such as a galvo or polygon (not shown in FIG. 7a)), this line of modulated white laser light could be scanned to provide an addressed two dimensional image. Such a system could be used, for example, for high brightness, limited view angle signage, or alternately for color image printing or projection, provided that the color beams from the organic laser array 300 were changing in a color sequential manner. Systems can also be configured with three organic laser arrays 300, one per color, for use in higher power image printing or image projection applications, where each color modulated signal must be provided continuously. The various designs and applications for the organic laser array 300 will be better explained, after some of the various configurations for illuminating the organic laser array 300 are further explored.

In the system as illustrated in FIG. 7a, the illumination of the organic laser array 300 is likely not uniform within a few percent. For example the electrodes 510 typically introduce shadows in the center of the beam that could lower the on axis intensity at the laser array. Alternately if the arc is imaged to the laser array, the resulting illumination typically will gradually fall-off in a Gaussian like manner. If the optical pumping illumination system of FIG. 7a was configured as a traditional Koehler style system, sufficient uniformity might be provided for an application where the cross array illumination tolerance at the laser array is relaxed.

Figure 7B:
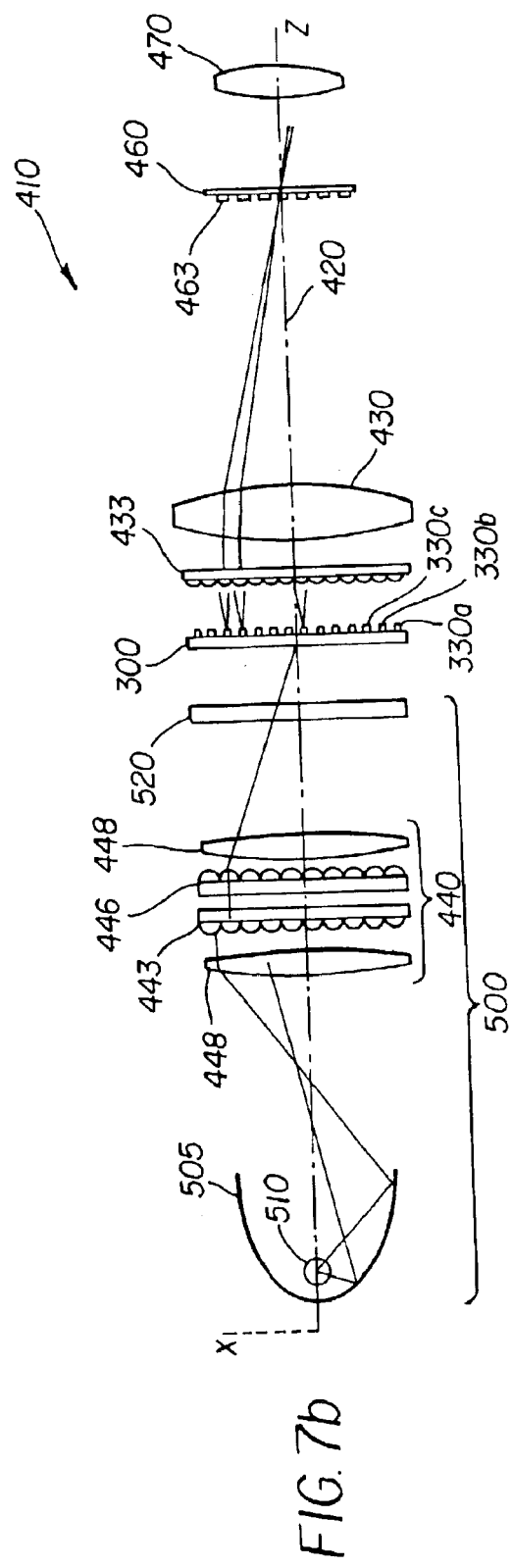

The system of FIG. 7b illustrates an alternate optical pumping illumination system 500 within a modulation optical system 410, as seen with a cross sectional XZ view. In this case, laser emitters 330a, 330b, 330c, etc. from only a single row of laser emitters 330 are visible in the illustration. As previously discussed, it is generally desirable in this plane to illuminate the linear spatial light modulator array 460 with uniform light. For this discussion it is assumed that the quantum conversion efficiency of pump light into lasing light is highly uniform across the organic laser array, such that uniform illumination of the laser array translates into uniform power emitted from laser emitter to laser emitter across the array. In that case, the uniformity of the illumination to the laser array principally determines the uniformity of illumination to the modulator array. The optical pumping illumination system of FIG. 7b then includes both a lamp 505 and light homogenization optics, which in this case is a fly's eye integrator 440. As is well understood in the art, a fly's eye integrator breaks an input light beam into a number of smaller beamlets, and then overlap images them to create uniform illumination. In the case of the system of FIG. 7b, the fly's eye integrator could comprise cylindrical optics, with optical power only in the XZ plane, so that only the array direction illumination of the organic laser array is homogenized. Alternately, if it is also important to homogenize the cross array direction illumination for light uniformity within a few percent, then the fly's eye integrator 440 could utilize spherical optics, and thus provide light homogenization along both meridians. A field lens (not shown) could be placed prior to linear spatial light modulator array 460, to either make the illumination telecentric to the modulator array, or alternately, to enhance light coupling through the imaging lens 470, by imaging light into the pupil of that lens.

To further exemplify alternatives for optical pumping of the organic laser array 300, FIG. 7b depicts modulation optical system 410 with a lamp 505, where the electrodes 510 are viewed in cross section from the end. This is generally illustrative of the use of a medium pressure mercury lamp light source, which has two end electrodes bridged by a long arc, from which light is emitted. As another alternative, an excimer lamp that generates light in the gap between two parallel long electrodes, could be used. Both the medium pressure mercury lamp and the excimer lamp are more efficient UV light sources than is a xenon lamp. Light collection from such lamps can be efficiently achieved using cylindrical reflectors, rather than the surface of rotation reflector discussed with FIG. 7a. In the case of FIG. 7b, lamp 505 utilizes a reflector 507 which is a cylindrical elliptical, with the reflector having optical power to focus light only in the cross array direction (XZ plane). Alternately, the system of FIG. 7b could be used with such an elongate UV light source while using a cylindrical elliptical reflector having optical power in the array direction, or with a cylindrical parabolic reflector, or with other reflector profiles. Of course, the system of FIG. 7b could be constructed with a short arc lamp and a surface of rotation reflector as in FIG. 7a.

The system of FIG. 7c illustrates another alternate optical pumping illumination system 500 within a modulation optical system 410, as seen with a cross sectional YZ view, in which a lamp 505 with a reflector 507 with a parabolic profile illuminates the organic laser array 300 with "collimated" light. The cross-sectional view shows multiple rows of laser emitters 330, 332, 334, etc., as represented by single laser emitters (330a for example) for the organic laser array 300. As with the system depicted in FIG. 7a, the electrodes block light, thereby creating a shadow (low intensity region) in the center of the beam that will only be partially filled in as the illumination light beam propagates. Again, light uniformizing optics, such as the fly's eye integrator depicted in FIG. 7b, can be used to improve the illumination of the laser array, in the cross array direction (YZ), the array direction (XZ), or both. Alternately, a diffuser 515, such as a holographic diffuser from Physical Optics Inc. of Torrance, Calif., could be used to improve illumination uniformity to the laser array.

The system of FIG. 7c is also depicted as operating without the benefit of combiner lenslet array 433. The primary function of combiner lenslet array 433 is to collect/collimate the light emitted by organic laser array 300 with mutually incoherent emitters so that brightness is conserved and LaGrange is limited. In optical systems, the term LaGrange (or etendue) refers to a quantity, which is the product of the spatial extent (H) of the source and the angular extent ($\theta$) of the source. In the case of the organic laser array, the array direction LaGrange for a single emitter is $E=H*\theta=(L/2)*\alpha$, while the cross array direction LaGrange for a single emitter is $E=H*\theta=(w/2)*\beta$, where the dimensional quantities are defined in FIGS. 4a and 4b. In the case of FIG. 4a, the combiner lenslet array 433 nominally collimates the laser light from each laser emitter in the cross array direction. To first order, this has the effect of limiting the cross array LaGrange to being the product of the number (N) of rows of laser emitters and the cross array direction LaGrange of an emitter in a row, or $E=N*(w/2)*\beta$. Likewise, in the case of FIG. 7b, the combiner lenslet array 433 limits the LaGrange collected from the organic laser array 300 to being the product of the number (M) of laser emitters in a row and the array direction LaGrange of an emitter in a row, or $E=M*(L/2)*\alpha$. In contrast, in the system of FIG. 7c, the light from organic laser array 300 is collected without the benefit of a combiner lenslet array 433, and the effective cross array LaGrange is $E=(Wa/2)*\beta$, which is calculated including with the full array width Wa, and thus including the spaces between the rows of emitters. As a result, the cross array LaGrange $((Wa/2)*\beta)$ collected for the case of FIG. 7c is much larger than the cross array LaGrange $(N*(w/2)*\beta)$ collected for the case of FIG. 7a. Thus brightness, which is the ratio of the collected power over the emitting extent (LaGrange), is much larger for the case of FIG. 7a than it is for the case of FIG. 7c (assuming that the organic laser arrays 300 of FIGS. 7a and 7c emit the same total power and also that the combiner lenslet array 433 introduces only modest light losses from absorption or scattering). This in turn means that the brightness at the spatial light modulator array 460 is higher, as it then would be at a target plane. The increased brightness translates into the ability to provide a higher power density or a reduced angular extent, either of which may improve the operation of the overall system. Although the combiner lenslet arrays 433 discussed in relation to FIGS. 7a and 7b were implied to have cylindrical construction (optical power in one axis only), combined lenslet array 433 can comprise spherical lens elements, so that the collected LaGrange is minimized in both planes. Also, it should be noted that the calculation of LaGrange across the organic laser array 300 was somewhat simplified. For example, in the cross array direction, the LaGrange of a single mode laser emitter providing a Gaussian beam can be calculated as $E=\lambda/\pi$, which introduces a wavelength dependence. This means that in organic laser arrays 300 comprising laser emitters with substantially variant wavelengths (such as red (630 nm) and green (540 nm)), the total LaGrange for the array is not a simple product of the emitter LaGrange and the number of emitters.

The previous discussion has assumed that the emitters in the scan direction are mutually incoherent (i.e. not phase-locked). In the phase-locked case, the LaGrange is dictated by the nature of the super-modes produced by the phase-locked array. For the special case of the fundamental super-mode, the LaGrange is the diffraction-limited Gaussian beam, $E=\lambda/\pi$. Thus, beam combining is not useful in the scan direction when the organic laser array 300 is phase-locked in the scan direction.

In most systems, the design criteria for the cross array direction will be determined by the optical power requirements and the cross array LaGrange limitations of the modulator array, although constraints at the target plane may also apply. If the allowed cross array LaGrange is quite large (large pixel width and large NA), it may be sufficient to overlap cross array incoherent Gaussian or small mode beams without the use of a cross array combiner lenslet array 430 (as in FIG. 7c). If the cross array LaGrange is somewhat smaller, it may be sufficient to overlap cross array incoherent Gaussian beams while using a combiner lenslet array 430 to optically remove the spaces between the rows of emitters (as in FIG. 7a). If the allowed cross array LaGrange is very small, it may be necessary to have the laser emitters phase locked across the entire laser array to produce a cross array super-mode, or phase locked in the manner of FIG. 4e, with groups of phase locked emitters 305.

The system of FIG. 7d depicts an alternate optical pumping illumination system 500 where the pump light source is an LED array 550 used to illuminate the organic laser array 300. In this case, the LED array 550 can either be an inorganic solid state device, or an organic or polymer device (O-LED or P-LED), provided that the emitted light covers the UV to low-Blue pump spectrum needed for visible organic lasers. The LED array 550 consists of a series of LED emitters 553, which typically emit highly divergent light. In the system of FIG. 7d, which is shown as a YZ cross sectional view, the light from the LED emitters 553 is collected and re-imaged in overlapping fashion at the organic laser array 300 by illumination lenslet array 540 and illumination combiner lens 537. Illumination field lens 535 is utilized to make the illumination nominally telecentric to the organic laser array 300. As in previous cases, overlap flood illumination of the organic laser array 300 by the light from the LED emitters 553 will provide redundancy against the failure of individual emitters, but not necessarily illumination uniformity. However, again, in the YZ plane, which corresponds to the cross array direction at the modulator array 460, generally redundancy is required while non-uniformity can be tolerated. But, if each of the LED emitters 553 emit generally uniform light, then the light from the multitude can be combined at the organic laser array 300 to provide uniform illumination. Edge roll off effects could then be solved most simply by adding extra LED emitters at the edges of the LED array 550, so that the laser array is actually over-illuminated.

Alternately, uniform illumination of the organic laser array 300 can be provided by combining the LED array 550 with a fly's eye integrator 440, as depicted in the optical pumping illumination system 500 of FIG. 7e. The system of FIG. 7e is shown configured with the optics of the fly's eye integrator 440 having power in the XZ plane, with the intention of nominally providing uniform illumination in the array direction at both the organic laser array 300 and the spatial light modulator array 460. Of course, the fly's eye integrator 440 can be used to provide uniform illumination in only the cross array direction by using cylindrical optics with power in the YZ plane, or to provide uniform illumination in both the array and cross array directions by using lenses and lenslets with spherical cross-sectional profiles.

As another alternative, FIG. 7f illustrates a YZ plane cross-sectional view of an optical pumping illumination system 500 where the LED array 550 illuminates the organic laser array 300 directly, without the benefit if an intermediate optical system. In such a system, it would be preferable to have the light from any LED emitter 553 illuminate a multitude of laser emitters (such as 330a, 330b, 332a, 332b) in one or two dimensions, to provide a partial pump source redundancy, although less so than the prior cases where each LED emitter flood illuminates the entire laser array. The system of FIG. 7f has fewer components, which would provide both a lower system cost and a more compact system as compared to the prior examples.

The exemplary optical pumping illumination systems of FIGS. 7b and 7e both utilized fly's eye integrators 440 to prepare the light illuminating the organic laser array 300 to the desired level of uniformity. Although the fly's eye integrator can be preferred due to its design flexibility and performance, other optics, including light diffusers, fiber arrays, and integrating bars can be used in providing uniform illumination. FIG. 7g illustrates an alternate configuration, where an integrating bar (also known as a light pipe) 480 is used to help provide uniform illumination of the laser array in the XZ plane (array direction for the spatial light modulator array 460). Condensor relay lens 485 images the output face of the integrating bar 480 onto the organic laser array 300, with the possible assistance of field lenses (not shown) to improve performance.

As yet another alternative, FIG. 7h illustrates an optical pumping illumination system 500 where the organic laser array 300 is illuminated by a pump laser 570, whose output beam is modified and prepared by beam shaping optics 575. In this case, the beam shaping optics 575 are depicted as a two lens simple beam expander, although other optical systems, including a single lens, prism beam expanders, telescopic expanders such as a three lens Keplerian system, and light integrators such as a fly's eye system or a Gaussian to "top-hat" beam converter, could be used to prepare the laser beam from pump laser 570 to illuminate the organic laser array 300.

Figures 7I, 8A:
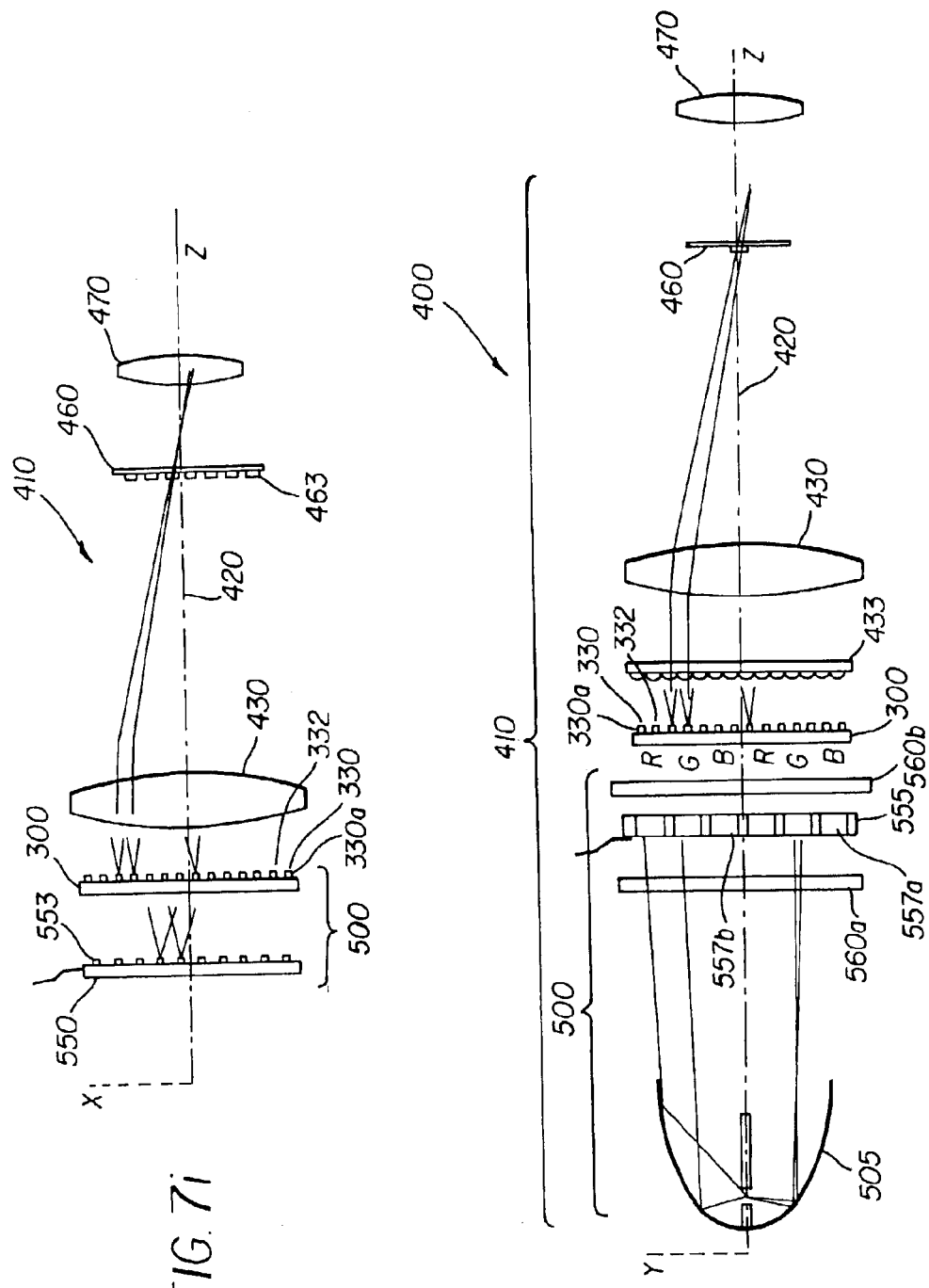

As yet one more alternative, FIG. 7i illustrates an XZ plane cross-sectional view of an optical pumping illumination system 500, where an LED array 550 is the pump source that illuminates the organic laser array 300 directly, and the organic laser array 300 in turn is imaged onto the spatial light modulator array 460. As shown, this system is simplified and fairly compact, although any cross array optics (optical power in the XZ plane) are not shown. The main advantage of this system is that illumination levels can be controlled to compensate for variations in modulation performance from pixel 463 to another pixel 463 across the spatial light modulator array 460. In greater detail, this system provides the illumination light from the LED array 550 to the organic laser array 300 directly, without intervening light homogenization optics. Then, by controlling the addressed signals to the LED emitters 553 of the LED array 550, the illumination across the organic laser array 300 is deliberately varied. The organic laser array 300 will emits its' light, with a profile generally matched to that from the LED array 550. The profile is varied so that the light emitted by the organic laser array 300, when re-imaged onto the spatial light modulator array 460, compensates for the variations in modulator performance. This system will generally work better to compensate for pattern performance variations across the spatial light modulator array 460, than abrupt pixel to pixel variations. It could also be used to correct for vignetting and $cos^4\theta$ fall-offs in the imaging lens 470.

In the initial discussion concerning the use of an organic laser array 300, combined with optical pumping, to form a multi-color modulated laser light source useful for printing or projection, the potential for a color sequential system utilizing a single organic laser array 300 arranged with a pattern of RGB laser emitters, was discussed. This can be better understood in relation to the modulation optical system 410 of FIG. 8*a*. In this system, the organic laser array 300 is preceded by an illumination modulator 555, which modulates the incident illumination light. In the example shown in FIG. 8*a*, two illumination modulator pixels (such as 557*a* and 557*d*) control the pump illumination to the blue laser emitters of organic laser array 300. Likewise, other modulator pixels control the pump illumination to the green and red emitters. The net illumination to the spatial light modulator array 460 can be driven color sequentially, by turning the pixels of the illumination array ON or OFF in a color sequential manner. In such a system, it is ideal to map the pattern of pixels on the illumination modulator 555 to the organic laser array 300 with little spillage, so as to minimize color crosstalk. An optical system (not shown) could be inserted if needed between the illumination modulator array 555 and the organic laser array 300, to help minimize cross talk between addressed colors. The illumination modulator 555 could for example be a transmissive LCD array device, used in combination with a pre-polarizing filter 560*a* and polarization analyzing filter 560*b*. It is generally preferable to locate the illumination modulator 555 prior to the organic laser array 300, rather than after it, as the pump source illumination can be readily increased to compensate for transmission losses through the illumination modulator 555 and associated filters.

Figure 8B:
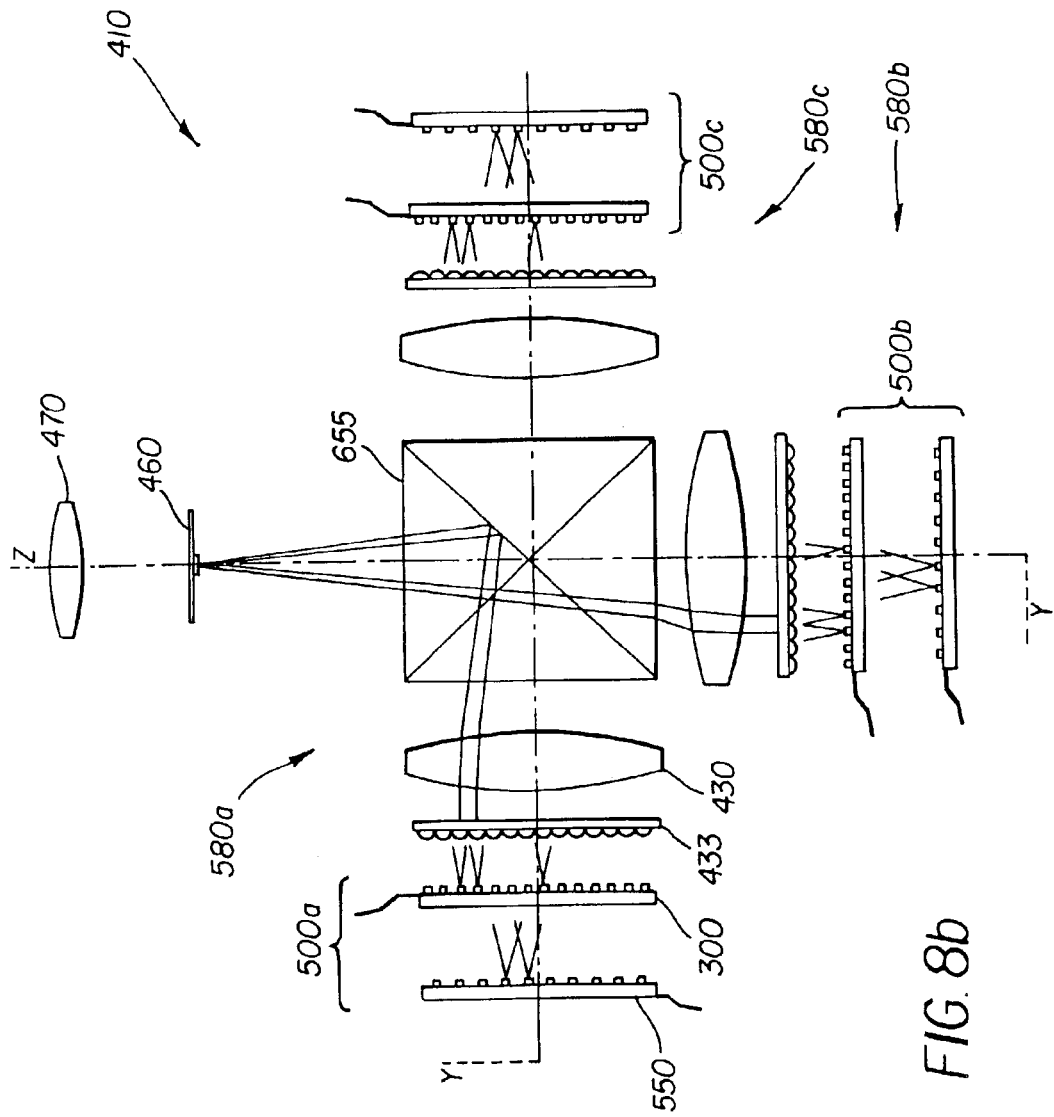
FIG. 8b depicts an alternate configuration for a modulation optical system employing multiple organic vertical cavity laser arrays utilized in combination with a single spatial light modulator array.

In FIG. 8*b*, a second modulation optical system 410 which can provide color sequential operation for use in image printing or image projection is depicted, which partially comprises three modulation channels 580*a*, 580*b*, 580*c*. Each modulation channel has its own optical pumping illumination systems 500 and organic laser array 300, from which the emitted laser light is combined by a combining prism 655 to simultaneously illuminate spatial light modulator array 460. For simplicity, the optical pumping illumination system 500 depicted in FIG. 8*b* utilize the compact system depicted in FIG. 7*f*, although any of the optical pumping illumination systems depicted in FIGS. 7*a*–7*h* could be utilized. Preferably each optical pumping illumination system 500 corresponds to a given color, such that for example, system 500*a* provides blue light, system 500*b* provides green light, and system 500*c* provides red light. The combining prism 655 in FIG. 8*b* is shown as an X-prism (reference U.S. Pat. No. 5,098,183 by Sonehara, for example), although other combiners such as a Philips prism (reference U.S. Pat. No. 3,202,039 by DeLang) or crossed plates could be used. In any case, the combiner will be a combination of one or more dichroic coatings, which re-direct (transmit or reflect) light based primarily on the wavelength of that light. Color sequential operation can be provided by operating the LED arrays 550 in a periodic manner, switching from one color to the next, in synchronization with the image data being supplied to the spatial light modulator array 460. Although this system is more complicated than that of FIG. 8*a*, it does have the advantage of potentially providing more visible laser light in each of the color bands, as each color has an entire organic laser array 300 as a light source. The design of the combining prism 655 can be advantaged compared to most projection systems, because the spectral bandwidth of the laser light can be rather narrow and precisely controlled.

It should be understood that there are other color sequential imaging system configurations where organic laser arrays 300 can be effectively used, besides those shown in FIGS. 8*a* and 8*b*. As an example, U.S. Pat. No. 5,410,370 by Jannsen describes a color sequential projection system where a light source is split into three parallel color beams, which are then scrolled across a single transmissive LCD, which supplies the image data. An organic laser array 300, similar to the one shown in FIG. 8*a*, could be used as a replacement light source for the color filtered lamp source of the U.S. Pat. No. 5,410,370 system.

Figure 8C:
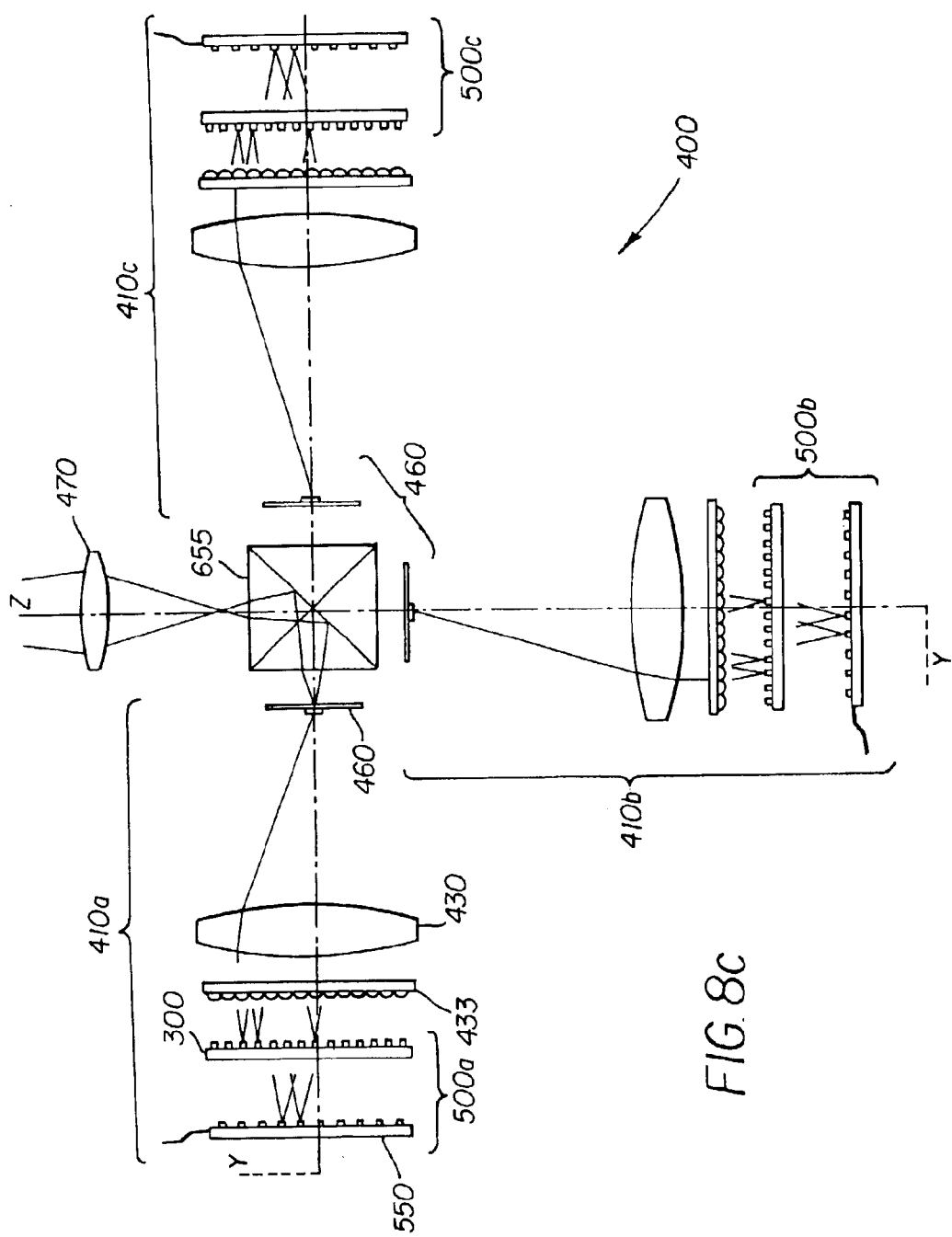
FIG. 8c depicts an imaging system employing multiple organic vertical cavity laser arrays utilized in combination with multiple spatial light modulator arrays.

Color sequential systems can be advantageous for applications where the cost and size of the system are of paramount concern, but for applications where system brightness or color rendition has higher priority, such systems are disadvantaged. Thus, FIG. 8*c* depicts an imaging system 400, which is similar to that of FIG. 8*b*, except that the color channels each comprise a modulation optical systems 410, each of which are complete with both an optical pumping illumination system 500 and a spatial light modulator array 460. After the three color channels are independently modulated, a combining prism 655 can be used to redirect the three beams down a common optical path, where an imaging lens 470 can then project an overlapped image of the three modulator arrays. Although this system utilizes three modulator arrays 460, and is thus disadvantaged by increased cost, the delivered brightness is at least tripled, as the respective color signals are delivered continuously. As an illustration of an imaging system 400, FIG. 8*c* is incomplete, as image creation by the scanning of an image of the linear spatial light modulator arrays 460 across a target plane is not shown. It also should be understood that the imaging lens 470 has been shown throughout this application as a simple single element lens, when in reality, a multi-element lens would be used. In the case of FIG. 8*c*, imaging lens 470 could have field lens elements located between the combining prism 655 and the spatial light modulator arrays 460.

Figure 8D:
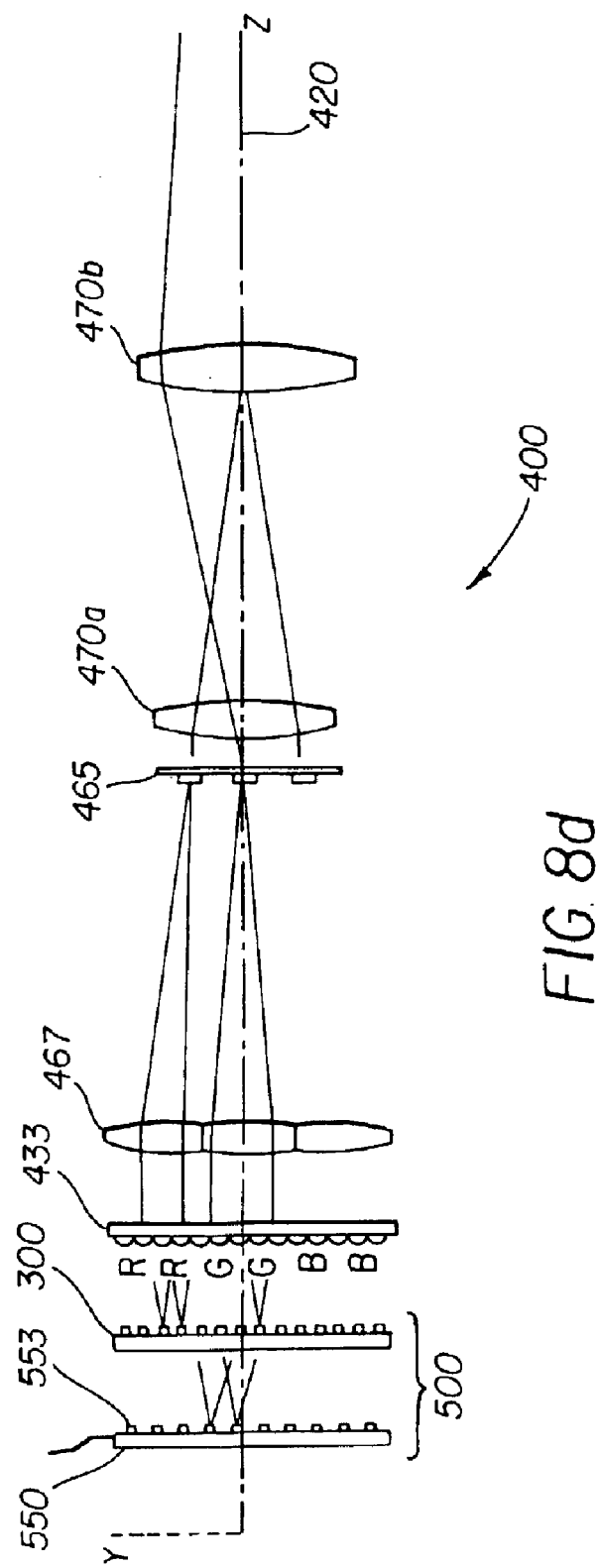
FIG. 8d depicts an alternate configuration for an imaging system employing a multi-color organic vertical cavity laser array in combination with a tri-linear spatial light modulator array.

As another alternative, which is shown in FIG. 8*d*, a single, multi-color organic laser array 300 can be combined with a tri-linear modulator array 465 to provide three color lines of independently modulated laser light. The organic laser array 300 can comprise multiple rows of laser emitters 330, 332, 334, etc., in an arrangement where some rows comprise red emitters, other rows comprise blue emitters, and yet other rows comprise green emitters. The organic laser array 300 is similar to the laser array provided in the system of FIG. 8*b*, except that the optical pumping illumination system does not include a illumination modulator 555 to provide color sequential operation, but rather the pump source provides light continuously. Rather, the light from the rows of laser emitters 330, etc. of a given color band (green for example) are condensed onto one modulator array of the tri-linear modulator array 465, while light from the other color rows of laser emitters are condensed respectively onto the other modulator arrays. In FIG. 8*d*, a combiner lenslet array 433 and a combiner field lenslet array 467 are used in combination to condense light on the tri-linear modulator array 465. Each modulator array is supplied with image data of the respective color in an appropriately synchronized manner. The tri-linear modulator array 465 can then be imaged to a target plane by an imaging lens, which is shown as two elements (field lens 470*a* and imaging lens 470*b*), where scanning will enable reconstruction of the full two dimensional, three color image. The tri-linear modulator array 465 can be constructed monolithically, or with three closely spaced separate modulator arrays 460.

Figure 9A:
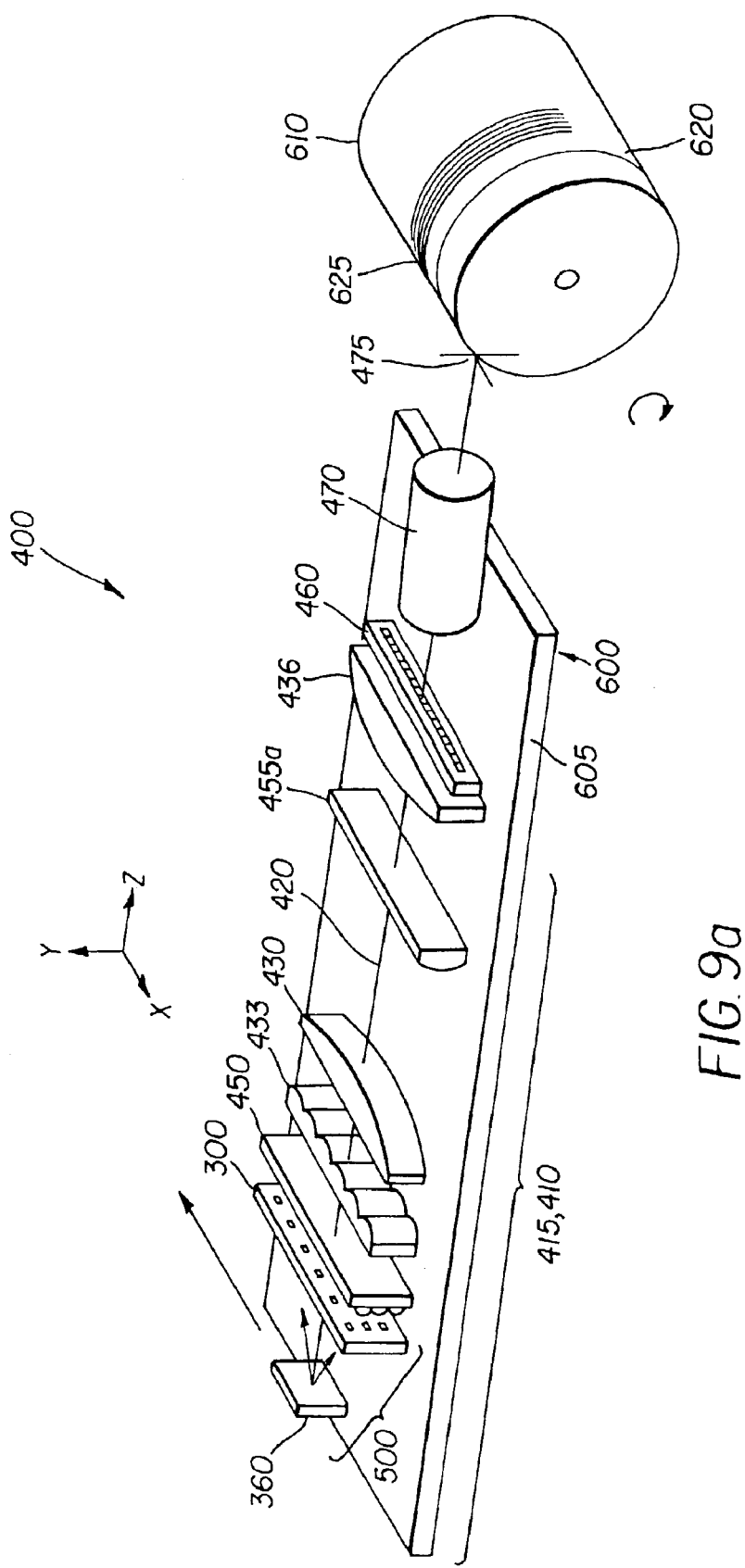
FIG. 9a depicts a complete imaging system wherein the vertical cavity organic laser array is used in combination with a spatial light modulator array and other optics and mechanics, in order to scan an image across a target plane.
Figure 9B:
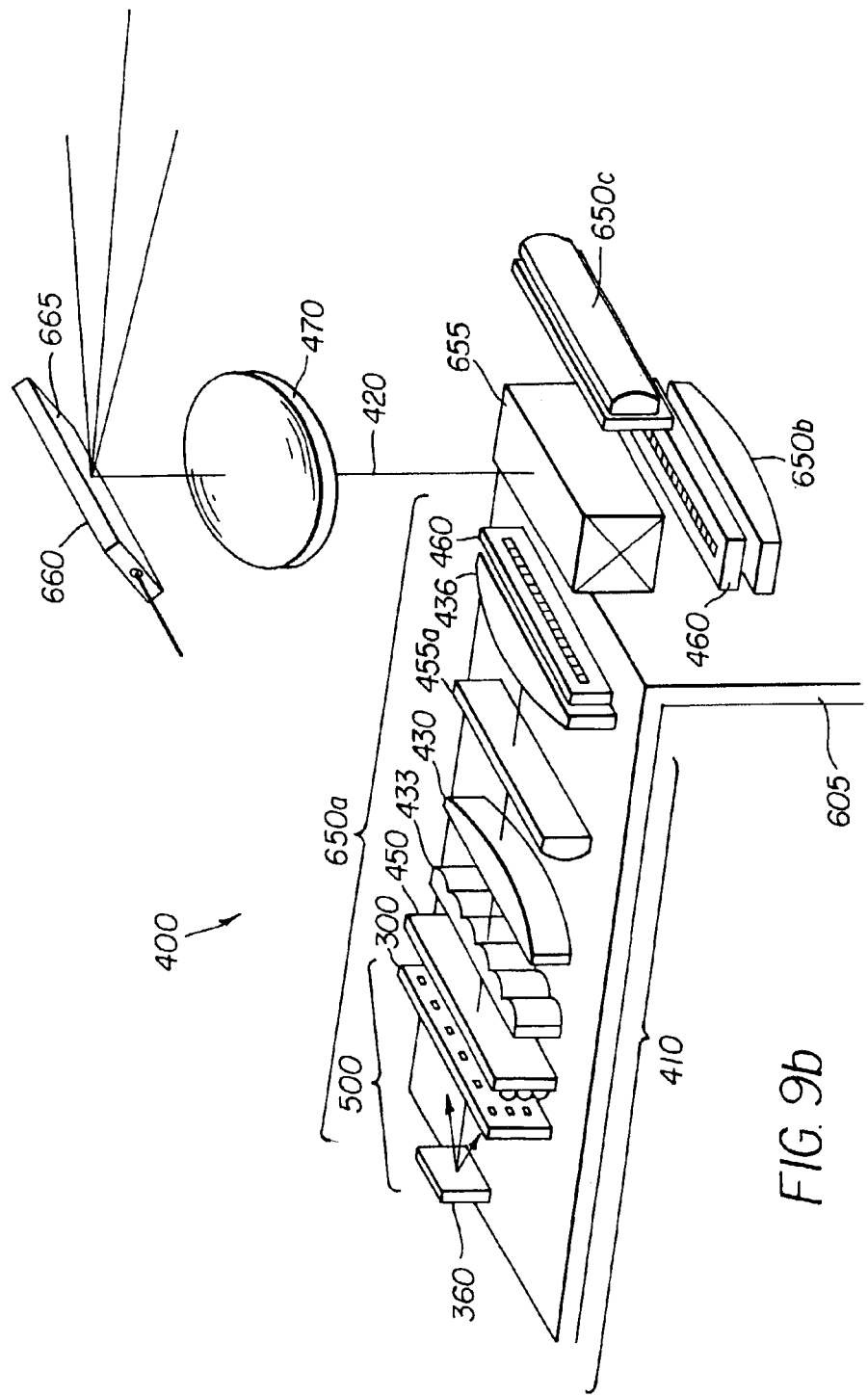
FIG. 9b depicts an alternate complete imaging system wherein the vertical cavity organic laser array is used in combination with a spatial light modulator array and other optics and mechanics, in order to scan an image across a target plane.

The imaging systems depicted in FIGS. 8*a*, 8*b*, and 8*c* illustrate conceptual designs by which one or more organic laser arrays 300 can be used in combination with linear spatial light modulator arrays 460 to create a line of modulated full color laser light. FIGS. 9*a* and 9*b* illustrate more fully the potential use of imaging systems employing organic laser arrays in printing and projection display applications. In particular, FIG. 9a depicts an imaging system applicable for printing, where the a printhead 600 comprises an imaging lens 470, which projects an image of the linear spatial light modulator array 460 onto a light sensitive media 620. The printhead 600, which is built on a mechanical frame 605, is translated laterally, while the media 620 is rotated by a drum 610, so that a printed swath 625 of image data is written onto the media 620. For simplicity, the organic laser array 300 is shown as optically pumped by a light source 360, although some of the optical pumping illumination systems depicted in FIGS. 7a through 7g could be used in the system. Alternately of course, electrically pumped organic laser arrays could be used. To provide full color imaging with a single printhead, this system would require a multi-channel approach with three organic laser arrays 300, as in FIG. 8c, or a system with a tri-linear modulator array 465, as described with FIG. 8d, or a color sequential configuration with one or more organic laser arrays 300.

In prior discussions, various attributes of the organic laser arrays 300 of the present invention have been described. Initially, as shown in FIGS. 4a and 4b, the advantageous construction of organic laser arrays 300 comprising multiple rows of laser emitters that are multi-mode in the array direction and single mode in the cross array direction was discussed. The preferred beam profiles of the emitted laser light were then discussed with relation to FIGS. 6a–6c. The additional point was then made that the emitted laser light across the organic laser array 300 should be mutually incoherent (phase de-coupled) from laser emitter to laser emitter, even if the laser emitters nominally emit the same wavelength light, in order to minimize interference fringe effects when the light is overlapped. Advantageous constructions of the organic laser arrays 300 were subsequently discussed, where a given laser array might provide a constant color (all green laser light) or laser light of the three primary colors (RGB) from a single device.

However, yet another point needs to be made, wherein the design of the organic laser array 300 provides advantages to the design of the imaging system 400. In the prior examples of FIGS. 8b, 8c, and 9b, the color channels are provided with a given organic laser array 300 providing "red", "green" or "blue" light. Moreover, examples have been given where the representative wavelengths were 630 nm, 540 nm, and 460 nm, where generally the bandwidth at each of these lasing wavelengths is typically 1.0 nm. The advantages of the organic laser array 300, which include the ability to pattern emitters, pattern devices, and select the lasing wavelength, have greater possibilities than so far described. Certainly, in many visual imaging systems, it can be advantageous to provide narrow spectral widths in each spectral band, as the color gamut expands and the specification for the color filters and prisms ease. On the otherhand, lasers with narrow bandwidths (less than ~3 nm, and particularly less than 1 nm) can suffer speckle when this coherent laser light interferes with itself, such as due to scatter from a rough screen surface. Speckle is a special interference effect that can dramatically reduce uniformity. In the representative optical pumping illumination systems 500 where light homogenizers are used, such as the fly's eye integrator or an integrating bar, interference can occur when light from a laser emitter is split up and overlapped with itself. Interference is avoided if light from adjacent laser emitters of organic laser array 300 is mutually incoherent, even if the laser wavelength is nominally the same. Overlap of light from the many emitters will tend to wash out speckle. However, there can be a tendency for adjacent emitters of the same nominal wavelength to cluster in mutually coherent groups, with the effect in the system of amplifying laser speckle. Laser speckle can be further reduced by designing the laser array to consist of laser emitters with bandwidths of 4 nm or greater. However, for the VCSEL structure described in FIGS. 1–3, this would require the use of a very low-finesse microcavity, which would imply a high pump threshold density due to the transmission loss through the mirrors. Alternately, speckle can be reduced by expanding the defining lasing wavelengths for a given color to consist of multiple wavelengths. For example, the green light could consist of laser emitters operating at multiple wavelengths, such as 540 nm, 545 nm, and 550 nm, preferably with an approximately equal number of laser emitters for each wavelength. Preferably, the laser wavelengths would vary approximately uniformly throughout this 10 nm range. Again with respect to exemplary FIGS. 8b, 8c, and 9b, in a given organic laser arrays 300, the nominal emitter wavelengths could be vary randomly or periodically from emitter to emitter, or vary in clusters across the array, or vary from row to row, etc.

It should also be pointed out that the design of the organic laser arrays 300, with control of both the nominal lasing wavelengths within the visible spectrum, as well as the size and number of laser emitters devoted to a specific color spectrum (red, green, and blue respectively) provides an additional advantage for color balancing. In particular, the number of laser emitters 328 of each color, as well as the wavelength of those laser emitters, can be adjusted to provide a desired color balance as needed for a given application. For example, in printing applications, a larger number of blue emitters may be needed, if the media 620 has a low blue exposure sensitivity.

Alternately, FIG. 9b shows an imaging system 400, similar to that of FIG. 8c, where three modulation optical systems 410 are used to provide modulated three color visible laser light as three color channels 650a, 650b, and 650c, which are then combined via a combining prism 655. In this case, a post objective scanner is depicted, where a galvanometer scanner 660 is provided after the imaging lens 470. As the galvanometer scanner 660 is swept through its motion, the imaging light is reflected off the galvo mirror 665 and scanned across a target plane, to provide a two-dimensional image. If a screen is provided at that target plane, the imaging system 400 is a projection display system, but if a light sensitive media is provided, the imaging system 400 constitutes a printing system. Again for simplicity, basic optical pumping with a light source 360 is shown, although some of the more complete optical pumping illumination systems 500 from FIGS. 7a through 7g could be used in this system.

Thus far, the organic laser array 300, as shown on FIG. 4a, has been described as consisting of multiple rows of laser emitters 330, 332, 334, etc., each comprising a series of laser emitters, such as 330a, 330b, 330c, etc., while various combinations of variable mode structure and lasing wavelength have been discussed as being patterned across the entire laser array, in order to be optimized for various applications and system configurations. It should however be understood that the structure of organic laser array 300 could be varied in other useful ways. In particular, as shown in FIG. 4c, the organic laser 300 could consist of generalized laser emitters 328 that are "indefinite" in length. In the prior discussion related to FIG. 4b, the generalized laser emitters 328 were described as having a length (L), a width (w), a pitch (p) between emitters within a row, and a pitch (p2) between rows of laser emitters. If however, the generalized laser emitters 328 were not configured in an array pattern in X, but were extended without an intervening gap for nearly the full length of the substrate 310, then an organic laser array 300 as depicted in FIG. 4c would result. For example, a single generalized laser emitter 328, fabricated for single mode emission in Y and multimode emission in X could be <1–5 μm wide (w) and 20 mm in length (L). The emitted laser light could have minimal spatial coherence in the long direction, and could even experience filamentation, which would in turn degrade the array direction uniformity. If the emitted laser light from a single generalized laser emitter 328 illuminated a spatial light modulator array 460 directly in X, or with direct imaging without light homogenization, the modulator array would experience the light profile non-uniformities, which would be less than ideal. If however, multiple (N) rows of laser emitters 330, 332, 334, etc. of generalized laser emitters 328 with very long multimode extents in X were used, in combination with a combiner lenslet array 433 and a combiner field lens 430 (both having optical power only in the YZ plane), to overlap illuminate the modulator array 460, a simplified modulation optical system 410 would result that could meet the illumination uniformity requirements. In this simplified system, the combiner lenslet array 433 is one-dimensional, lacking optical power in the XZ plane. Additionally with the illumination in the array direction (X relative to the modulator array) sufficiently uniform, a fly's eye integrator 440 or integrating bar 480 would not be needed to correct for pump source or organic laser light profile non-uniformities. For this to be true however, the generalized laser emitters 328 across the multiple rows 330, 332, 334 could not have any pattern errors in the X direction, such as deep laser non-uniformity occurring in the same location from one laser emitter to the next. Then, overlap imaging of the N rows of laser emitters would average the light profiles of the individual emitters, providing uniform illumination and removing non-uniformity effects to a considerable extent (depending on the number N of averaged rows).

It should also be understood that although the organic laser array 300 is generally depicted as comprising periodically spaced rows of laser emitters (pitch "p2"), wherein each row comprises periodically a series of periodically spaced (pitch "p") laser emitters, that the position of both the rows of laser emitters and the laser emitters within the rows could be varied randomly, quasi-randomly, or with variable periodicity. For example, FIG. 4d illustrates a portion of an alternate exemplary organic laser array 300, where the laser emitters 328 are patterned with a pitch "p" or a starting position in a given row, that vary from one row of laser emitters to the next row. In this case, when the light from the (N) multiple rows of laser emitters is combined and overlapped to flood illuminate a target plane (where the modulator array 460 resides), the resulting illumination could be sufficiently uniform without the use of homogenization optics such as a fly's eye integrator. The laser emitter length (L) could also be variable within the rows of laser emitters. Likewise, as another example of an organic laser array 300 construction, the nominal wavelength of laser emission could be variable, either randomly or a periodically for the laser emitters formed within the rows or laser emitters of from one row of laser emitters to another row.

For simplicity, the various system illustrations have all depicted the linear spatial light modulator array 460 as a transmissive device. For example, the modulator array 460 could be a transmissive liquid crystal display (LCD). While LCDs are commonplace, the typical devices are area array modulators, and linear array modulators are virtually unheard of. Moreover, most LCDs operate by changing the polarization state of the incident light. Although the organic laser arrays 300 can be designed to provide polarized laser light, the emitted laser light otherwise is generally un-polarized. Polarizing the light from the organic laser array 300, so as to pair it with an LCD, would introduce a significant light loss, unless a polarization conversion system was also used. In such a case, therefore, it would be preferable to design an organic laser array 300 so that the laser emitters 328 produce polarized laser light. This can be accomplished through the design of the emitter shape, such that, for example asymmetry of the emitter shape can induce polarization in the emitted light. Alternately, the spatial light modulator array 460 could be an asymmetric Fabry-Perot etalon modulator, which is a transmissive modulator that switches between transmissive and reflective states. U.S. Pat. No. 5,488,504 by Worchesky et al. describes such a modulator. As another transmissive modulator alternative, the rolling MEMS shutter modulator described in U.S. Pat. No. 5,233,459 by Bozler, could be used, as it also switches between transmissive and reflective states.

Although a transmissive modulator array is advantageous for keeping the imaging systems 400 relatively simple, a wider range of useful reflective modulator technologies have been developed, which can be used for visible wavelength light modulation. These devices are generally made using MEMS technologies, rather than electro-optical means. Viable reflective modulator arrays that can be combined with the organic laser arrays 300 in these systems include the digital mirror device (DMD) described in U.S. Pat. No. 5,535,047 by Hornbeck, the grating light valve (GLV) as described in U.S. Pat. No. 5,311,360 by Bloom et al., and the conformal grating modulator described in U.S. Pat. No. 6,307,663 by Kowarz. For these reflective modulators, the various imaging systems 400, such as that of FIG. 9a, would need to be appropriately modified to illuminate the reflective modulator array and collect the modulated image light. The modulated image light would be directed into the imaging lens 470, so that the modulator array could be imaged to the target plane. The imaging system 400 could be folded to allow collection of the modulated image light. Alternatively, to retain a compact mechanical design, the imaging system 400 could be modified to deflect light out of the main optical path onto the reflective modulator array and to send the modulated image light back into the main optical path. For grating light valves, the optical systems are Schlieren type systems, with spatial filters placed at or near a Fourier plane to distinguish between the modulated image light and the non-image light. The Fourier plane for spatial filtering would typically be within the imaging lens 470. For the digital mirror device and the conformal grating modulator, non-Schlieren systems can be used, with a spatial filter located between the modulator array and the imaging lens 470.

It should be understood that this invention, as relates to organic laser arrays, and their use in illumination systems, modulation optical systems, and imaging systems, is described in numerous ways, but that are other variations and obvious changes that are not described, but which would fall within the scope of this invention.

Parts List

10 Vertical cavity organic laser structure
20 Substrate
30 Bottom dielectric stack
35 Organic laser film structure
40 Organic active region
50 Top dielectric stack 60 Pump beam
65 Pump light source
70 Laser emission
80 Vertical cavity organic laser structure
100 Periodic gain regions
103 Anti-node
105 Node
110 Organic spacer layers
120 Electromagnetic field pattern
190 Phase-locked organic laser array
200 Lasing emitters
210 Inter-emitter regions
220 Etched regions
300 Organic laser array
305 Group of phase-locked emitters
310 Substrate
325 Gap
328 Generalized laser emitter
330 Row of laser emitters
330a Laser emitter
330b Laser emitter
330c Laser emitter
330d Laser emitter
330e Laser emitter
330f Laser emitter
330g Laser emitter
330h Laser emitter
330i Laser emitter
330j Laser emitter
330k Laser emitter
332 Row of laser emitters
334 Row of laser emitters
336 Row of laser emitters
338 Row of laser emitters
340 Row of laser emitters
342 Row of laser emitters
350 Laser light
360 Light source
365 Illumination light
370 Electrical leads
400 Imaging system
410 Modulation optical system
420 Optical axis
430 Combiner field lens
433 Combiner lenslet array
436 Array field lens
440 Fly's eye integrator
450 Cross array lenslet array
455a Cross array lens
455b Cross array lens
460 Spatial light modulator array
463 Pixel
465 Tri-linear modulator array
467 Combiner field lenslet array
470 Imaging lens
470a Field lens
470b Imaging lens
475 Target plane
480 Integrating bar
485 Condensor relay lens
500 Optical pumping illumination system
500a Blue light optical pumping illumination system
500b Green light optical pumping illumination system
500c Red light optical pumping illumination system
505 Lamp
507 Reflector
510 Electrode
515 Diffuser
520 Filter
525 Leaky source filter
530 Illumination relay lens
535 Illumination field lens
537 Illumination combiner
540 Illumination lenslet array
550 LED array
553 LED emitters
555 Illumination modulator
557a Modulator pixel
557b Modulator pixel
560a Pre-polarizing filter
560b Analyzing filter
570 Pump laser
575 Beam shaping optics
580a Modulation channel
580b Modulation channel
580c Modulation channel
600 Printhead
605 Mechanical frame
610 Drum
620 Media
625 Printed swath
650a Color channel
650b Color channel
650c Color channel
655 Combining prism
660 Galvanometer scanner
665 Galvo mirror

What is claimed is:

1. An organic vertical cavity laser light producing device, comprising:
   a) a substrate;
   b) a plurality of laser emitters emitting laser light in a direction orthogonal to the substrate, wherein each laser emitter within said plurality of laser emitters has a first lateral mode structure in a first axis orthogonal to the laser light direction and has a second lateral mode structure in a second axis orthogonal to both the laser light direction and said first axis, each laser emitter comprising:
      i) a first mirror provided on a top surface of the substrate and reflective to light over a predetermined range of wavelengths;
      ii) an organic active region for producing laser light;
      iii) a second mirror above the organic active region and reflective to light over a predetermined range of wavelengths; and
   c) a pumping means that excites said plurality of laser emitters.

2. An organic vertical cavity laser according to claim 1 wherein said laser emitters within said plurality of laser emitters are arranged to form an array, comprising one or more parallel rows of laser emitters, wherein within a row of laser emitters, a series of said laser emitters are arranged in sequence to form a line of laser emitters in an array direction; and
   wherein said parallel rows of laser emitters are arranged in a sequence in a cross array direction.

3. An organic vertical cavity laser according to claim 1 wherein said first lateral mode structure exhibits multi-mode lasing behavior; and
   wherein each of said laser emitters have said second lateral mode structure that exhibits a single mode lasing behavior.

4. An organic vertical cavity laser according to claim 2 wherein within each of said parallel rows of laser emitters, said laser emitters are arranged in a sequence having a periodic pattern, wherein the length of each of said laser emitters and the gap between each adjacent pair of said laser emitters is repeated along the full extent of a given row.

5. An organic vertical cavity laser according to claim 4 wherein said periodic pattern is the same for all of said parallel rows of laser emitters.

6. An organic vertical cavity laser according to claim 1 wherein said laser light emitted by said plurality of laser emitters is arranged to vary within the visible spectrum;
   wherein each of said laser emitters provides laser light at a given nominal emission wavelength with an emission spectral bandwidth; and
   wherein said nominal emission wavelength is variable within the visible spectrum for said plurality of laser emitters, such that the given nominal emission wavelength for one group of one or more of said laser emitters is different than the given nominal emission wavelength for another group of one or more of said laser emitters.

7. An organic vertical cavity laser according to claim 6 wherein said laser light emitted by said plurality of laser emitters is arranged to vary within the visible spectrum to provide multiple color output; and
   wherein said plurality of laser emitters are arranged in three groups of laser emitters, the first of which emits light at nominal wavelengths in the blue portion of the spectrum, the second of which emits light at nominal wavelengths in the green portion of the spectrum, and the third of which emits light at nominal wavelengths in the red portion of the spectrum.

8. An organic vertical cavity laser according to claim 2 said plurality of laser emitters are arranged in three groups of laser emitters to cover the color spectrum, the first of which emits laser light at nominal wavelengths in the blue portion of the spectrum, the second of which emits laser light at nominal wavelengths in the green portion of the spectrum, and the third of which emits laser light at nominal wavelengths in the red portion of the spectrum.

9. An organic vertical cavity laser according to claim 8 wherein said laser emitters emit laser light at multiple nominal wavelengths within a given color spectrum selected from red, green, or blue spectrum.

10. An organic vertical cavity laser according to claim 8 wherein each of said groups of laser emitters which cover a portion of the color spectrum comprise one or more rows of laser emitters, wherein all of said laser emitters within a given row of laser emitters, emit laser light within at nominal wavelengths within a given color spectrum.

11. An organic vertical cavity laser according to claim 10 wherein rows of laser emitters which cover a portion of the color spectrum by emitting laser light at nominal wavelengths within a given color spectrum are arranged in one or more clusters of adjacent rows of laser emitters.

12. An organic vertical cavity laser according to claim 1 wherein said laser emitters are arranged in groups of phase-locked laser emitters.

13. An organic vertical cavity laser according to claim 12 wherein said groups of phase-locked laser emitters are arranged in a two-dimensional array.

14. An organic vertical cavity laser according to claim 3 wherein said laser emitters that are aligned along said second axis and that exhibit single mode lasing behavior are phased locked to emit coherently and produce a super mode.

15. An organic vertical cavity laser according to claim 4 wherein said plurality of laser emitters that comprises said laser emitters, which are arranged in parallel rows of laser emitters, with a periodic pattern of placement of the laser emitters within said rows, where each of said laser emitters provides laser light at a given nominal emission wavelength with an emission spectral bandwidth; and
   wherein said plurality of laser emitters are arranged in three groups of laser emitters, the first of which emits light at nominal wavelengths in the blue portion of the spectrum, the second of which emits light at nominal wavelengths in the green portion of the spectrum, and the third of which emits light at nominal wavelengths in the red portion of the spectrum.

16. An organic cavity laser according to claim 1 wherein said substrate is an optically transparent dielectric material.

17. An organic cavity laser according to claim 1 wherein said pumping means that excites said plurality of laser emitters utilizes optical pumping, wherein pump light with an appropriate pumping spectrum is directed from a pump light source to back-illuminate and excite said laser emitters.

18. An organic cavity laser according to claim 16 wherein said pump light source is an incoherent light source, such as a xenon arc lamp, a mercury arc lamp, an excimer lamp, a light emitting diode (LED), or an array of light emitting diodes.

19. An organic cavity laser according to claim 18 wherein said first mirror is optically transparent to light from said pumping means.

20. An organic cavity laser according to claim 16 wherein said pump light is directed from said pump light source to back-illuminate said laser emitters by means of appropriate beam shaping and beam condensing optics, including elements selected from the group comprising fly's eye integrator, integrating bar, lenslet array, beam expander, illumination field lens and illumination relay lens.

21. An organic cavity laser according to claim 1 wherein said pumping means utilizes direct application of electronic drive signals to said laser emitters.

22. An organic cavity laser according to claim 1 wherein said organic cavity laser uses small molecule organic gain materials.

23. An organic vertical cavity laser array comprising:
   a) a substrate;
   b) a plurality of laser emitters emitting laser light in a direction orthogonal to the substrate, wherein each laser emitter within said plurality of laser emitters, has a first lateral mode structure in a first axis orthogonal to the laser light direction and has a second lateral mode structure in a second axis orthogonal to both the laser light direction and said first axis, each laser emitter comprising:
      i) a first mirror provided atop the substrate and reflective to light over a predetermined range of wavelengths;
      ii) an organic active region for producing laser light;
      iii) a second mirror provided above the organic active region and reflective to light over a predetermined range of wavelengths;
   c) an arrangement of said laser emitters within said plurality of laser emitters to form an array, comprising one or more parallel rows of laser emitters, wherein, within a row of laser emitters, a series of said laser emitters are arranged in sequence to form a line of laser emitters that are an array direction;
   wherein said parallel rows of laser emitters are arranged in a sequence along a cross array direction; and
   d) a pumping means that excites said plurality of laser emitters.

24. An organic vertical cavity laser array according to claim 23 wherein each of said laser emitters within said plurality of laser emitters has a first lateral mode structure, along a first axis that is aligned with said array direction, that exhibits multi-mode lasing behavior, and wherein each of said laser emitters within said plurality of laser emitters has a second lateral mode structure, along a second axis that is aligned with said cross array direction, that exhibits a single mode lasing behavior.

25. An organic vertical cavity laser array according to claim 24 wherein within each of said parallel rows of laser emitters, said laser emitters are arranged in a sequence having a periodic pattern, wherein the length of each of said laser emitters and the gap between each adjacent pair of said laser emitters is repeated along the full extent of a given row.

26. An organic vertical cavity laser array according to claim 25 wherein said periodic pattern is the same for all of said parallel rows of laser emitters.

27. An organic vertical cavity laser array according to claim 23 wherein said laser emitters have an extent along said first axis that is nearly the full length of said substrate.

28. An organic vertical cavity laser array according to claim 23 wherein said laser light emitted by said plurality of laser emitters is arranged to vary within the visible spectrum;
wherein each of said laser emitters provides laser light at a given nominal emission wavelength with an emission spectral bandwidth; and
wherein said nominal emission wavelength is variable within the visible spectrum for said plurality of laser emitters, such that the given nominal emission wavelength for one group of one or more of said laser emitters is different than the given nominal emission wavelength for another group of one or more of said laser emitters.

29. An organic vertical cavity laser array according to claim 28 wherein each of said laser emitters provides laser light at a given nominal emission wavelength with an emission spectral bandwidth; and
wherein said plurality of laser emitters are arranged in three groups of laser emitters, the first of which emits light at nominal wavelengths in the blue portion of the spectrum, the second of which emits light at nominal wavelengths in the green portion of the spectrum, and the third of which emits light at nominal wavelengths in the red portion of the spectrum.

30. An organic vertical cavity laser array according to claim 29 wherein said laser emitters emit laser light at multiple nominal wavelengths within a given color spectrum selected from red, green or blue spectrum.

31. An organic vertical cavity laser array according to claim 30 wherein each of said groups of laser emitters which cover a portion of the color spectrum comprise one or more rows of laser emitters, where all of said laser emitters within a given row of laser emitters, emit laser light within at nominal wavelengths within a given color spectrum.

32. An organic vertical cavity laser array according to claim 31 wherein rows of laser emitters which cover a portion of the color spectrum by emitting laser light at nominal wavelengths within a given color spectrum, are arranged in one or more clusters of adjacent rows of laser emitters.

33. An organic vertical cavity laser according to claim 23 wherein said laser emitters are arranged in groups of phase-locked laser emitters.

34. An organic vertical cavity laser according to claim 33 wherein said groups of phase-locked laser emitters are arranged in a two-dimensional array.

35. An organic vertical cavity laser array according to claim 24 wherein a group of said laser emitters within said plurality of laser emitters that are along a second axis that is aligned with said cross array direction, and exhibit single mode lasing behavior are phase-locked so as to emit coherently and produce a super mode.

36. An organic vertical cavity laser array according to claim 23 wherein said laser array is multimode in both directions, with many fewer modes in the second axis direction than in the first axis direction.

37. An organic vertical cavity laser array according to claim 23 wherein said organic laser array uses small molecule organic gain materials.

38. An organic vertical cavity laser array comprising:
a) a substrate;
b) a plurality of laser emitters emitting laser light in a direction orthogonal to the substrate, wherein each laser emitter within said plurality of laser emitters, has a first lateral mode structure in a first axis orthogonal to the laser light direction that corresponds to multi-mode lasing behavior and has a second lateral mode structure in a second axis orthogonal to both the laser light direction and said first axis that corresponds to single mode lasing behavior, each laser emitter comprising:
  i) a first mirror provided atop the substrate and reflective to light over a predetermined range of wavelengths;
  ii) an organic active region for producing laser light;
  iii) a second mirror provided above the organic active region and reflective to light over a predetermined range of wavelengths;
c) an arrangement of said laser emitters within said plurality of laser emitters to form an array, comprising one or more parallel rows of laser emitters, wherein, within a row of laser emitters, a series of said laser emitters are arranged in sequence to form a line of laser emitters that are an array direction;
wherein said parallel rows of laser emitters are arranged in a sequence that is a cross array direction; and
d) a pumping means that excites said plurality of laser emitters.

39. An organic vertical cavity laser array according to claim 38 wherein a group of said laser emitters aligned to said second axis that operate with single mode lasing behavior are phase-locked to emit coherently, thereby providing a super-mode.

40. An organic vertical cavity laser array according to claim 38 wherein said laser array is multimode in both directions, with many fewer modes in the second axis direction than in the first axis direction.

41. An organic vertical cavity laser array according to claim 38 wherein said emitters emit light at nominal wavelengths in each of the primary colors.

42. An organic vertical cavity laser array according to claim 38 wherein said emitters are arranged in rows by the wavelength of light emitted.

43. An organic vertical cavity laser array according to claim 42 wherein said rows emitting light of a specific wavelength respectively are arranged in groups.

44. An organic vertical cavity laser array according to claim 38 wherein said laser array has laser emitters in an array direction that extend a full length of the substrate.

45. An organic vertical cavity laser array according to claim 38 wherein said laser array has parallel rows of emitters where the rows have a variable structure, including offsets, different emitter lengths, different emitter pitches.

46. An organic vertical cavity laser array according to claim 38 wherein said substrate is a transparent dielectric substrate.

47. An organic vertical cavity laser array according to claim 46 wherein said optical pumping means provides backlit illumination through the transparent substrate.

48. An organic vertical cavity laser array according to claim 46 wherein said incident optical pump light is uniform.

49. An organic vertical cavity laser array according to claim 47 wherein said optical pumping means is incoherent.

50. An organic vertical cavity laser array according to claim 38 wherein said pumping means is a arc lamp, an excimer lamp, an LED, or an LED array.

51. An organic vertical cavity laser array according to claim 38 wherein said organic laser array uses small molecule organic gain materials.

52. An organic vertical cavity laser array according to claim 38 wherein said laser array emits polarized light.

53. An illumination system utilizing an organic laser array comprising:
   a) a pump light source for emitting pump light;
   b) optical means, comprising illumination beam shaping optics, for preparing said pump light to illuminate an organic vertical cavity laser array;
   c) an organic vertical cavity laser array comprising:
      i) a substrate;
      ii) a plurality of laser emitters emitting laser light in a direction orthogonal to the substrate, wherein each laser emitter within said plurality of laser emitters, has a first lateral mode structure in a first axis orthogonal to the laser light direction and has a second lateral mode structure in a second axis orthogonal to both the laser light direction and said first axis, each laser emitter comprising:
         c1) a first mirror provided atop the substrate and reflective to light over a predetermined range of wavelengths;
         c2) an organic active region for producing laser light;
         c3) a second mirror provided above the organic active region and reflective to light over a predetermined range of wavelengths; and
      iii) an arrangement of said laser emitters within said plurality of laser emitters comprising one or more parallel rows of laser emitters, wherein, within at least one of said rows of laser emitters, a series of said laser emitters are arranged in sequence to form a line of laser emitters in an array direction; and wherein said parallel rows of laser emitters are arranged in a sequence in a cross array direction.

54. An illumination system utilizing an organic laser array according to claim 53 wherein said first lateral mode structure is multi-mode and said second lateral mode structure is single mode.

55. An illumination system utilizing an organic laser array according to claim 53 wherein said laser emitters are arranged in groups of phase-locked laser emitters.

56. An illumination system utilizing an organic laser array according to claim 55 wherein said groups of phase-locked laser emitters are arranged in a two-dimensional array.

57. An illumination system utilizing an organic laser array according to claim 53 wherein said pump light incident to said laser array is uniform.

58. An illumination system utilizing an organic laser array according to claim 53 wherein said pump light source is a xenon arc lamp, a mercury arc lamp, an excimer lamp, or a LED.

59. An illumination system utilizing an organic laser array according to claim 53 wherein said pump light source is an LED array.

60. An illumination system utilizing an organic laser array according to claim 53 wherein an LED array illuminates said laser array directly, without beam shaping optics.

61. An illumination system utilizing an organic laser array according to claim 53 wherein said pump light source is a laser.

62. An illumination system utilizing an organic laser array according to claim 53 wherein said illumination beam shaping optics are a condensing and relay optical system.

63. An illumination system utilizing an organic laser array according to claim 53 wherein such illumination beam shaping optics include an optical diffuser.

64. An illumination system utilizing an organic laser array according to claim 59 wherein illumination beam shaping optics include a lenslet array and a combiner lens.

65. An illumination system utilizing an organic laser array according to claim 59 wherein illumination beam shaping optics include a fly's eye integrator.

66. An illumination system utilizing an organic laser array according to claim 59 wherein illumination beam shaping optics include an integrating bar.

67. An illumination system utilizing an organic laser array according to claim 53 wherein illumination beam shaping optics include a light homogenization system, such as a fly's eye or an integrating bar.

68. An illumination system utilizing an organic laser array according to claim 53 wherein illumination beams shaping optics are anamorphic.

69. An illumination system utilizing an organic laser array according to claim 53 wherein said illumination system includes a spectral filter for removing undesirable wavelengths from the spectrum of the pump light source.

70. An illumination system utilizing an organic laser array according to claim 53 wherein illumination beam shaping optics for said pump source include beam expanding optics.

71. An illumination system utilizing an organic laser array according to claim 53 wherein said pump light source includes means to control the drive signals across an LED array to adjust a light profile to control uniformity.

72. A modulation optical system with an organic laser array comprising:
   a) an organic vertical cavity laser comprising:
      i) a substrate;
      ii) a plurality of laser emitters emitting laser light in a direction orthogonal to the substrate, wherein each laser emitter within said plurality of laser emitters has a first lateral mode structure in a first axis orthogonal to the laser light direction and has a second lateral mode structure in a second axis orthogonal to both the laser light direction and said first axis, each laser emitter comprising:
         a1) a first mirror provided atop the substrate and reflective to light over a predetermined range of wavelengths;
         a2) an organic active region for producing laser light;
         a3) a second mirror provided above the organic active region and reflective to light over a predetermined range of wavelengths;
         a4) an arrangement of said laser emitters within said plurality of laser emitters to form an array, comprising one or more parallel rows of laser emitters, wherein, within a row of laser emitters, a series of said laser emitters are arranged in sequence to form a line of laser emitters in an array direction;

wherein said parallel rows of laser emitters are arranged in a sequence in a cross array direction;

b) a pumping means that excites said plurality of laser emitters;

c) optical means, comprising laser beam shaping optics for preparing laser light from said organic vertical cavity laser to illuminate a linear spatial light modulator array; and d) wherein said linear spatial light modulator array comprises an arrangement of individually addressed modulator pixels, each of which alter incident laser light in accordance with applied drive signals specific to each of said pixels.

73. A modulation optical system with an organic laser array according to claim 72 wherein said first lateral mode structure is multi-mode and said second lateral mode structure is single mode.

74. A modulation optical system with an organic laser array according to claim 72 wherein said laser emitters are arranged in groups of phase-locked laser emitters.

75. A modulation optical system with an organic laser array according to claim 74 wherein said groups of phase-locked laser emitters are arranged in a two-dimensional array.

76. A modulation optical system with an organic laser array according to claim 72 wherein said laser array is multimode in both directions, with many fewer modes in the second axis direction than in the first axis direction.

77. A modulation optical system with an organic laser array according to claim 72 wherein said laser array is single mode in the second axis direction, and multi-mode in the first axis direction, and the emitters extend nearly the full length of the array in the first axis direction.

78. A modulation optical system with an organic laser array according to claim 72 wherein said organic laser array has multiple nominal laser emission wavelengths spanning the visible spectrum.

79. A modulation optical system with an organic laser array according to claim 72 wherein said pumping means is optical and said substrate is transparent.

80. A modulation optical system with an organic laser array according to claim 72 wherein said optical pumping means uses an incoherent pump light source.

81. A modulation optical system with an organic laser array according to claim 80 wherein said pump light from said incoherent pump light source includes illumination beam shaping optics.

82. A modulation optical system with an organic laser array according to claim 81 wherein said illumination beam shaping optics comprise fly's eye integrators.

83. A modulation optical system with an organic laser array according to claim 81 wherein said illumination beam shaping optics are anamorphic.

84. A modulation optical system with an organic laser array according to claim 72 wherein said linear spatial light modulator array is transmissive.

85. A modulation optical system with an organic laser array according to claim 72 wherein said linear spatial light modulator is a micro-mechanical mirror device with pixels.

86. A modulation optical system with an organic laser array according to claim 72 wherein said linear spatial light modulator array is reflective.

87. A modulation optical system with an organic laser array according to claim 72 wherein said reflective linear spatial light modulator array is a grating light valve or conformal grating device.

88. A modulation optical system with an organic laser array according to claim 72 wherein said laser beam shaping optics image said organic laser array onto said linear spatial light modulator array.

89. A modulation optical system with an organic laser array according to claim 88 wherein said beam shaping optics comprise a combiner lenslet array for collecting light from said organic laser array and a combiner lens for imaging said laser emitters in an overlapping fashion to a common focus.

90. A modulation optical system with an organic laser array wherein said beam shaping optics according to claim 88 are anamorphic.

91. A modulation optical system with an organic laser array according to claim 72 wherein said modulation optical system includes a spectral filter located after said organic laser array for removing pump source light that has leaked through said organic laser array.

92. A modulation optical system with an organic laser array according to claim 72 wherein said modulation optical system permits the pumping means to be locally addressed, so that the incident light profile onto said organic laser array is adjusted, thereby providing a means to adjust the incident light profile incident on said linear spatial light modulator array, to correct for a non-uniform response of said modulator array.

93. A modulation optical system according to claim 72 which is a color sequential modulation optical system:

a) wherein said laser emitters are grouped, so that one or more groups output light in the blue portion of the visible spectrum, one or more groups emit light in the red portion of the visible spectrum, and one or more groups emit light in the green portion of the visible spectrum;

b) wherein said pumping means is optical and utilizes a pump light source providing pump light;

c) wherein an illumination modulator array is provided in an optical path traversed by said pump light, but prior to said organic laser array;

d) wherein pixels of said illumination modulator array are addressed and can be controlled in accordance with applied drive signals; and e) wherein groups of said pixels correspond to groups of said laser emitters of a respective color, and modulation of the groups can be cycled through to provide color sequential modulation.

94. A modulation optical system according to claim 93 wherein said illumination modulator is a transmissive liquid crystal display (LCD).

95. A modulation optical system according to claim 93 wherein said modulation optical system employs three organic laser arrays, one per color to comprise color channels, where the color beams are combined via a wavelength sensitive combining optic to illuminate said linear spatial light modulator.

96. A modulation optical system according to claim 93 wherein said modulation optical system has either one laser array with three primary colors or three laser arrays, each for a given color, combined to provide white laser light illumination of the linear spatial light modulator (SLM), and the SLM modulates the white laser light.

97. An electronic imaging system with an organic laser array comprising:

a) one or more organic vertical cavity lasers, each comprising:

i) a substrate;

ii) a plurality of laser emitters emitting laser light in a direction orthogonal to the substrate, wherein each laser emitter within said plurality of laser emitters, has a first lateral mode structure in a first axis orthogonal to the laser light direction and has a second lateral mode structure in a second axis orthogonal to both the laser light direction and said first axis, each laser emitter comprising:
- a1) a first mirror provided on atop the substrate and reflective to light over a predetermined range of wavelengths;
- a2) an organic active region for producing laser light;
- a3) a second mirror provided above the organic active region and reflective to light over a predetermined range of wavelengths;
- a4) an arrangement of said laser emitters within said plurality of laser emitters to form an array, comprising one or more parallel rows of laser emitters, wherein, within a row of laser emitters, a series of said laser emitters are arranged in sequence to form a line of laser emitters in an array direction; wherein said parallel rows of laser emitters are arranged in a sequence in a cross array direction;

b) a pumping means that excites said plurality of laser emitters;

c) optical means, comprising laser beam shaping optics for preparing laser light to illuminate a linear spatial light modulator array; which comprises modulator pixels that are individually addressed with applied drive signals bearing data; and d) imaging optics to re-image the linear spatial light modulator array onto a target plane.

98. An electronic imaging system with an organic laser array according to claim 97 wherein said electronic imaging system is a printing system with a light sensitive media located at the target plane.

99. An electronic imaging system with an organic laser array according to claim 97 wherein said first lateral mode structure is multi-mode and said second lateral mode structure is single mode.

100. An electronic imaging system with an organic laser array according to claim 97 wherein said organic laser array providing light over a predetermined range of wavelengths are providing primary color visible light.

101. An electronic imaging system with an organic laser array according to claim 97 wherein said laser emitters are arranged in rows.

102. An electronic imaging system with an organic laser array according to claim 97 wherein said rows of laser emitters are arranged in groups.

103. An electronic imaging system with an organic laser array according to claim 97 wherein said groups of rows are controlled or addressed so that they can be driven color sequentially, to provide a color sequential system.

104. An electronic imaging system with an organic laser array according to claim 97 wherein said pump means is optical.

105. An electronic imaging system with an organic laser array according to claim 97 wherein said electronic imaging system employs three organic laser arrays, one per color arranged in color channels.

106. An electronic imaging system with an organic laser array according to claim 105 wherein said color channels has multiple nominal lasing wavelengths within each color band.

107. An electronic imaging system with an organic laser array according to claim 105 has light from three color laser array brought together into one beam via a color sensitive combiner onto a single spatial light modulator (SLM), which is then imaged to said target plane.

108. An electronic imaging system with an organic laser array according to claim 105 wherein:
- color channels which each include an SLM and beam shaping optics to focus light onto said SLM;
- a combining dichroic optic to combine the three color channels onto a common optical path; and
- an imaging lens to project an overlapped three color linear image onto a target plane.

109. An electronic imaging system with an organic laser array according to claim 108 includes a scanner, such as a galvanometer or a polygon which sweeps the three color linear image across the target plane to form a 2D image.

110. An electronic imaging system with an organic laser array according to claim 109 has a screen at the target plane.

111. An electronic imaging system with an organic laser array according to claim 109 has a light sensitive at the target plane.

112. An electronic imaging system with an organic laser array according to claim 108 is moved in relation to a target plane, and a rotating drum resides at said target plane, bearing a light sensitive media, such that combined movement of the system and the rotation of the drum allows printing of a 2D image.

113. An electronic imaging system with an organic laser array according to claim 98 is moved in relation to a target plane, and a rotating drum resides at said target plane, bearing a light sensitive media, such that combined movement of the system and the rotation of the drum allows printing of a 2D image.

114. An electronic imaging system with an organic laser array according to claim 113 wherein said first lateral mode structure is single mode and said second lateral mode structure is multimode.

115. An electronic imaging system with an organic laser array according to claim 113 utilizes an organic laser array that has a single color.

116. An electronic imaging system with an organic laser array according to claim 113 utilize an organic laser array that is three color, with said three colors driven sequentially.

117. An electronic imaging system with an organic laser array according to claim 97 further comprising focusing optics to overlap.

118. An electronic imaging system with an organic laser array according to claim 97 wherein said laser beam shaping optics comprises focusing and homogenization optics.

119. An electronic imaging system with an organic laser array according to claim 97 wherein said laser array is multimode in both directions, with many fewer modes in the second axis direction than in the first axis direction.

120. An electronic imaging system with an organic laser array comprising:
- a) one or more organic vertical cavity lasers, each comprising:
  - i) a substrate;
  - ii) a plurality of laser emitters emitting laser light in a direction orthogonal to the substrate, wherein each laser emitter within said plurality of laser emitters, has a first lateral mode structure in a first axis orthogonal to the laser light direction and has a second lateral mode structure in a second axis orthogonal to both the laser light direction and said first axis, each laser emitter comprising:
    - a1) a first mirror provided atop the substrate and reflective to light over a predetermined range of wavelengths;
    - a2) an organic active region for producing laser light;
    - a3) a second mirror provided above the organic active region and reflective to light over a predetermined range of wavelengths;

a4) an arrangement of said laser emitters within said plurality of laser emitters to form an array, comprising one or more parallel rows of laser emitters, wherein, within a row of laser emitters, a series of said laser emitters are arranged in sequence to form a line of laser emitters that are an array direction;

wherein said parallel rows of laser emitters are arranged in a sequence that is a cross array direction;

b) a pumping means that excites said plurality of laser emitters;

c) optical means, comprising laser beam shaping optics for preparing laser light to illuminate a tri-linear spatial light modulator array; which comprises three parallel rows of modulator pixels that are individually addressed with applied drive signals bearing data; and d) imaging optics to re-image the tri-linear spatial light modulator array onto a target plane.

121. An electronic imaging system according to claim 120 wherein said organic laser array has lasers clustered in groups of rows of lasers, where there are three groups, respectively being the red, green, blue (RGB) color channels, and the color channel groups are respectively imaged onto a row of pixels of said tri-linear spatial light modulator array.

122. An electronic imaging system according to claim 120 wherein said laser beam shaping optics comprise a combiner field lenslet array.

123. An electronic imaging system according to claim 120 wherein said pumping means is optical.

124. An electronic imaging system according to claim 120 wherein said optical pumping means is an LED array.

125. An electronic imaging system according to claim 120 wherein said first lateral mode structure is single mode and said second lateral mode structure is multi-mode.

126. An electronic imaging system according to claim 120 wherein said laser array has a supermode.

127. An electronic imaging system according to claim 120 wherein said laser array is multimode in both directions, with many fewer modes in the second axis direction than in the first axis direction.

* * * * *